(12) United States Patent
Chen et al.

(10) Patent No.: US 8,168,879 B2
(45) Date of Patent: May 1, 2012

(54) SOLAR THERMOELECTRIC CONVERSION

(75) Inventors: Gang Chen, Carlisle, MA (US);
Xiaoyuan Chen, Acton, MA (US);
Mildred Dresselhaus, Arlington, MA (US); Zhifeng Ren, Newton, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 12/431,052

(22) Filed: Apr. 28, 2009

(65) Prior Publication Data

US 2009/0260667 A1    Oct. 22, 2009

Related U.S. Application Data

(63) Continuation of application No. PCT/US2007/023776, filed on Nov. 13, 2007.

(60) Provisional application No. 60/858,515, filed on Nov. 13, 2006.

(51) Int. Cl.
*H01L 35/00* (2006.01)
*H01L 37/00* (2006.01)

(52) U.S. Cl. ...................................................... 136/206

(58) Field of Classification Search .................. 136/206
See application file for complete search history.

(56) References Cited

U.S. PATENT DOCUMENTS

| | | | |
|---|---|---|---|
| 389,124 A | 9/1888 | Weston | |
| 389,125 A | 9/1888 | Weston | |
| 527,377 A | 10/1894 | Severy | |
| 527,379 A | 10/1894 | Severy | |
| 608,755 A | 8/1898 | Cottle | |
| 1,077,219 A | 10/1913 | Coblentz | |
| 2,984,696 A | 5/1961 | Shaffer | |
| 3,053,923 A | 9/1962 | Stearns | |
| 3,920,413 A * | 11/1975 | Lowery | 428/629 |
| 3,999,283 A * | 12/1976 | Dean et al. | 438/65 |

(Continued)

FOREIGN PATENT DOCUMENTS

DE    37 04 559    8/1988

(Continued)

OTHER PUBLICATIONS

Alternate Energy Technologies, LLC, AE-Series Collectors, available at (http://www.aetsolar.com/literature/MSC_Collector_Broshure.pdf.

(Continued)

*Primary Examiner* — Basia Ridley
*Assistant Examiner* — Allison Bourke
(74) *Attorney, Agent, or Firm* — Nutter McClennen & Fish LLP; Thomas J. Engellenner; Lydia G. Olson

(57) ABSTRACT

Systems and methods utilizing solar-electrical generators are discussed. Solar-electrical generators are disclosed having a radiation-capture structure and one or more thermoelectric converters. Heat produced in a capture structure via impingement of solar radiation can maintain a portion of a thermoelectric converter at a high temperature, while the use of a low temperature at another portion allows electricity generation. Thus, unlike photovoltaic cells which are generally primarily concerned with optical radiation management, solar thermoelectrics converters are generally concerned with a variety of mechanisms for heat management. Generators can include any number of features including selective radiation surfaces, low emissivity surfaces, flat panel configurations, evacuated environments, and other concepts that can act to provide thermal concentration. Designs utilizing one or more optical concentrators are also disclosed.

28 Claims, 16 Drawing Sheets

U.S. PATENT DOCUMENTS

| | | | | |
|---|---|---|---|---|
| 4,020,368 | A * | 4/1977 | Carney | 310/306 |
| 4,106,952 | A * | 8/1978 | Kravitz | 136/206 |
| 4,149,025 | A | 4/1979 | Niculescu | |
| 4,251,291 | A * | 2/1981 | Gomez | 136/206 |
| 5,433,263 | A * | 7/1995 | Ohnishi et al. | 164/347 |
| 5,959,240 | A | 9/1999 | Yoshida et al. | |
| 7,465,871 | B2 | 12/2008 | Chen et al. | |
| 2003/0099279 | A1 | 5/2003 | Venkatasubramanian et al. | |
| 2005/0087221 | A1 | 4/2005 | Shah et al. | |
| 2005/0109386 | A1 | 5/2005 | Marshall | |
| 2005/0252543 | A1 | 11/2005 | Stark et al. | |
| 2005/0252582 | A1 | 11/2005 | Ren et al. | |
| 2006/0000502 | A1* | 1/2006 | Fiorini et al. | 136/224 |
| 2006/0102224 | A1 | 5/2006 | Chen et al. | |
| 2007/0289622 | A1 | 12/2007 | Hecht | |
| 2008/0115817 | A1 | 5/2008 | Defries | |
| 2008/0142069 | A1 | 6/2008 | Lindstrom | |
| 2008/0202575 | A1 | 8/2008 | Ren et al. | |
| 2008/0250788 | A1 | 10/2008 | Nuel et al. | |
| 2009/0068465 | A1 | 3/2009 | Chen et al. | |

FOREIGN PATENT DOCUMENTS

| | | | |
|---|---|---|---|
| DE | 101 51 072 | | 4/2003 |
| DE | 103 39 952 | | 4/2005 |
| JP | 60 242683 | | 12/1985 |
| WO | WO 80/01438 | | 7/1980 |
| WO | WO2005074463 | * | 8/2005 |
| WO | WO 2006/113607 | | 10/2006 |
| WO | WO 2008/063474 | | 5/2008 |

OTHER PUBLICATIONS

Borca-Tasciuc, T. et al., "Experimental Techniques for Thin-Film Thermal Conductivity Characterization," in Thermal Conductivity: Theory, Properties, and Applications, Ed., TM Tritt, Kluwar Press, p. 205, New York (2004).

Caillat, T. et al., "Development of a High Efficiency Thermoelectric Unicouple for Power Generation Applications," $18^{th}$ Intl Conf on Thermoelectrics, p. 473, IEEE, Piscataway, NJ (1999).

Caillet, T. et al., "Progress in the Development of Segmented Thermoelectric Unicouples at the Jet propulsion Laboratory," Mat. Res. Soc. Symp. 626:Z11.6.1 Materials Research society (2000).

Chen, G. et al., "Phonon Transport in Low-Dimensional Structures," in Semiconductors and Semimetals 71:203, edited by T. Tritt, Academic Press, San Diego (2001).

Chen, G., "Potential Step Amplified Thermal-Electric Energy Converters," J. Appl. Physics 97:083707 (2005).

Chen, G. et al., "Recent Developments in Thermoelectric Materials," Intl. Materials Rev. 48:45 (2003).

Chen, G., "Thermal Conductivity and Ballistic-Phonon Transport in the Cross-Plane Direction of Superlattices," Phys. rev. B57:14958 (1998).

Chen, G. et al., "Thermoelectric Property Characterization of Low-Dimensional Structures,"Proc. 2oth Intl Conf. On Thermoelectrics, ICT'01, p. 30, Beijing, China, IEEE Press, IEEE Cat. No. 01TH8589, Pisctaway, NJ (Jun. 2001).

Conwell, EM, "High Field Transport in Semiconductors," in Solid-States Physics, Ed. F. Seitz et al., Supp. 9, p. 119, Academic Press, NY (1967).

DeLuca, R. et al., "Revisiting an Idea of G D Botto: A Solar Thermoelectric Generator," Eur. J. Phys. 29:1295-1300 (2008).

Dent, CL and Cobble, MH, "A Solar Thermoelectric Generator Experiment and Analysis," New Mexico State University.

Dresselhaus, MS, "Quantum Wells and Quantum Wires for Potential Thermoelectric Applications," Recent Trend in Thermoelectric Materials Research—Semiconductor and Semimetlas, III 71, p. 1, edited by T. Tritt, Academic press, San Diego (2001).

Fleming, JG et al., "All-Metallic Three-Dimensional Photonic Crystals with a Large Infrared Bandgap," Nature 417:52 (2002).

Froseth, AG et al., "Bonding in MgSi and Al-Mg-Si compounds Relevant to Al-Mg-Si Alloys," Phys. Rev. B67:224106 (2003).

Gleckman, P. et al., "Concentration of Sunlight to Solar-Surface Levels Using Non-Imaging Optics," Nature 339:198 (1989).

Harman, TC et al., "Nanostructured Thermoelectrics Materials," J. Electronic Materials 34:L19 (2005).

Harman, TC et al., "Quantum Dot Superlattice Thermoelectric Materials and Devices," Science 297:2229 (2002).

Heinzel, A. et al., "Radiation Filters and Emitters for the NIR Based on Periodically Structured metal Surfaces," J. Mod. Opt. 47:2399 (2000).

Henry, AS et al., "Spectral Phonon Transport Properties of Silicon Based on Molecular Dynamics Simulations and Lattice Dynamics," J. Computational and Theoretical Nanoscience 5:141-52 (2008).

Henry, CH, "Limiting Efficiencies of Ideal Single and Multiple Energy Gap Terrestrial Solar Cells," J. Appl. Physics 51:4494 (1980).

Hicks, LD et al., "Effect of Quantum-Well Structures on the Thermoelectric Figure of Merit," Phys. rev. B47:12727 (1993).

Hsu, KF et al, "Cubic $AgPb_m SbTe_{2+m}$: Bulk Thermoelectric Materials with High Figure of Merit," Science 303:818 (2004).

International Search Report, from PCT/US07/023776, mailed Mar. 13, 2009.

Jeng, MS et al., "Monte Carlo Simulation of Thermoelectric Properties of Nanocomposites," ICT05, Jun. 19, Clemson (2005).

Kajikawa, T., "Thermoelectric Power Generation Systems recovering Heat from Combustible Solid Waste in Japan," $15^{th}$ Intl Conf on Thermoelectrics, p. 343, IEEE, Pasadena, CA (1996).

Karni, J. et al., "A High-Pressure, High-Temperature Solar Receiver," Solar Energy Engineering-Transactions of the ASME, 119:74 (1997).

Kasymakhunova, A.M. et al., "Photothermoelectric Converters of Concentrated Radiation," Tech. Physics Letters 29(3):253-55 (2003).

Lee, H. et al., "Thermoelectric Properties of Si-Ge Nanocomposites," ICT'05, Jun. 19, Clemson (2005).

Luo, C. et al., "Thermal radiation from Photonic Crystals: A Direct Calculation," Phys. Rev. Lett. 93:213905 (2004).

Naito, H. et al., "Development of a Solar Receiver for a High-Efficiency Thermionic/Thermoelectric Conversion System," Solar Energy 58(4-6):191-95 (1996).

Narayanaswamy, A. et al., "Thermal Emission Control with One-Dimensional Metallodielectric Photonic Crystals," Phys. Rev. B70:125101-1-125101-4 (2004).

Novikov, AI, "Improvement of the Efficiency of a Solar Thermoelectric Battery," J. Eng. Physics & Thermophysics 74(1):224-29 (2001).

Omer, S.A. et al., "Design and Thermal Analysis of a Two Stage Solar Concentrator for Combined Heat and Thermoelectric Power Generation," Energy Conv.& Mgt. 41:737-56 (2000).

Raag, V. et al., "A Silicon-Germanium Solar Thermoelectric Generator," Energy Conv. 8:161-68 (1968).

Radizemska, E., "Thermal Performance of Si and GaAs Based Solar Cells and Modules: A Review," Prog. Energy combust., Science 29:407 (2003).

Solar Flat Plate Thermoelectric Generator Research, Quarterly Report No. 1 for the period Mar. 1, 1963 to Jun. 1, 1963, Flight Accessories Laboratory, Aeronautical Systems Division, Wright Patterson Air Force Base, Ohio, Project No. 8173, Task No. 817302 (Jun. 15, 1963).

Telkes, M., "Solar Thermoelectric Generators," J. Appl. Physics 25(6):765-77 (1954).

Tritt, TM and Subramanian, MA (Guest Editors), MRS Bulletin, Mar. 2006.

Vella, GJ et al., "Simple Experiments on the Use of Solar Energy," Physics Ed. pp. 413-416 (Sep. 1976).

Venkatasubramanian, R. et al., "Thin-Film Thermoelectric Devices With High Room-Temperature Figures of Merit," Nature 413:597 (2001).

Vorobiev, Y.V. et al., "Analysis of Potential Conversion Efficiency of a Solar Hybrid System with High-Temperature Stage," Trans. of the ASME 128:258-60 (May 2006).

Wang, W. et al., "High-Yield Synthesis of Single Crystalline Antimony Telluride Hexagonal Nanoplates Using a Low-Temperature Organic Solution Approach," JACS 127:13792 (2005).

Wang, W. et al., "Synthesis of Gramscale Geranium Nanocrystals by a Low-Temperature inverse Micelle Solvothermal Route," Nanotechnology 16:1126 (2005).

Wang, W. et al., "Synthesis of PbTe Nanoboxes Using a Solvothermal Technique," Advanced Materials 17:2110 (2005).

Xi, H. et al., "Development and Applications of Solar-Based Thermoelectric Technologies," Renewable & Sustainable Energy Rev. 11:923-36 (2007).

Yang RG et al., "Thermal Conductivity Modeling of Periodic Two-Dimensional Nanocomposites," Phys. Rev. B69:195316 (2004).

Yang, RG et al., "Thermoelectric Transport in Nanocomposites," SAE Conference Paper 2006-01-0289 (2006).

Ellmer et al., "Tranparent & Conducting ZnO(:A1) Films Deposited by Simultaneous RF- and DC-Excitation of a Magnetron," Thin Solid Films 317:413-16 (1998).

Poudel et al., "High-Thermoelectric Performance of Nanostructured Bismuth Antimony Telluride Bulk Alloys," Science 320:634-38 (2008).

Remote Power Solutions, Global Thermoelectric (2006).

Tominaga, "Transparent Conductive ZnO Film Preparation by Alternating Sputtering of ZnO:Al and Zn or Al Targets," Thin Solid Films 334:35-39 (1998).

Using Solar Energy for Solar Thermal Power Plants, Schott (2000).

Walker, A., "Solar Water Heating," Whole Building Design Guide (May 18, 2006).

Waste Heat Recovery Systems, hi-Z (2006).

High-performance flat-panel solar thermoelectric generators with large thermal concentration, Daniel Kraemer et at., Nature Materials, Mar. 23, 2011, Advance Online Publication, www.nature.com/naturematerials.

* cited by examiner

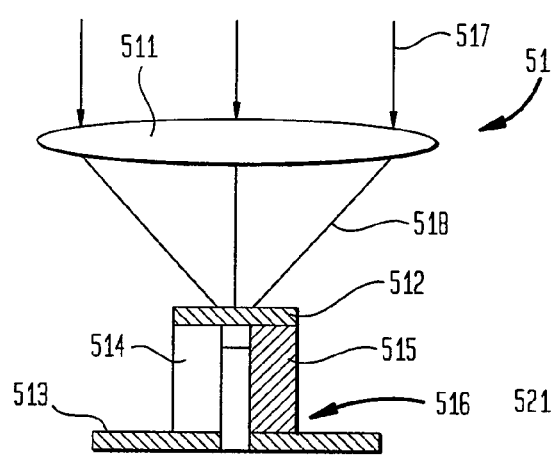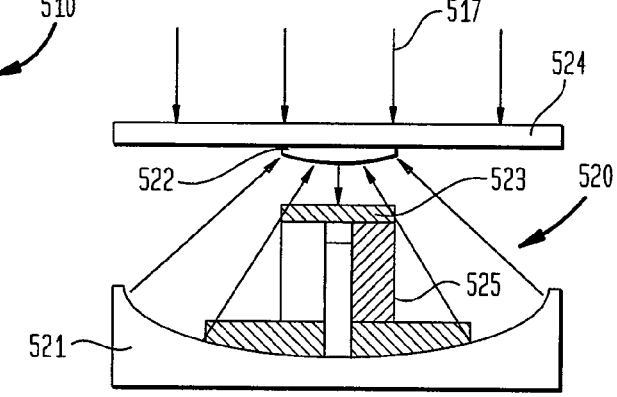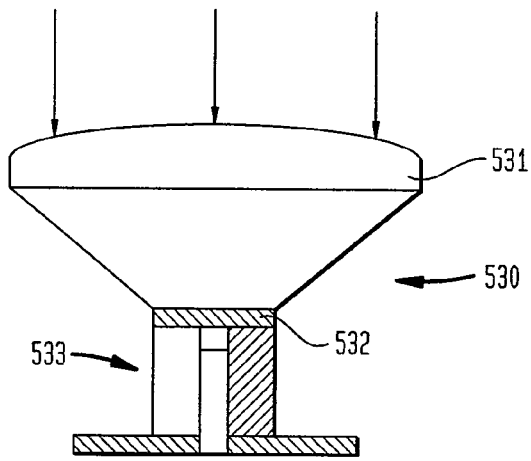

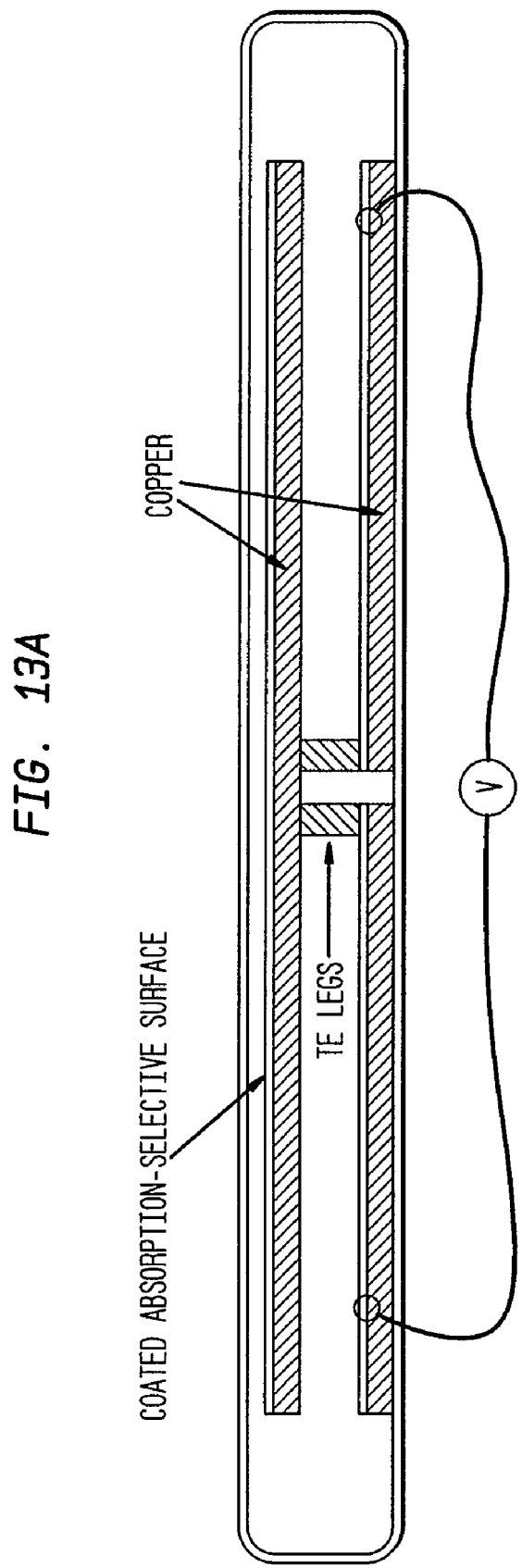

POWER VS LOAD

SOLAR THERMOELECTRIC CONVERSION

CROSS-REFERENCE TO RELATED APPLICATIONS

This application is a continuation of PCT Application No. PCT/US2007/023776, filed Nov. 13, 2007, entitled "Solar Thermoelectric Conversion," which claims the benefit of a U.S. Provisional Patent Application No. 60/858,515, filed Nov. 13, 2006. The entire contents of these applications are hereby incorporated by reference herein.

FIELD OF THE APPLICATION

The present application relates generally to methods and devices for the conversion of solar energy, and in particular to such methods and devices that can perform solar thermoelectric conversion.

BACKGROUND

Utilization of solar energy can be classified as solar-photovoltaic and solar-thermal. Solar photovoltaic (PV) converts photon energy directly into electricity. The other is solar-thermal, which typically converts photon energy into heat stored in a terrestrial heat source such as a fluid, usually through an optical concentrator, and uses mechanical heat engines to generate electricity. Photovoltaic cells can be used on rooftops, while the solar-thermal energy conversion by mechanical heat engines is more suitable for large-scale power generation applications.

While the current solar-thermal to electricity conversion relies on steam-generation and mechanical heat engines, the prospect of using thermoelectric generator materials to convert solar energy first into heat and then into electricity has been pursued, but has not been widely utilized because of the low efficiency of thermoelectric devices. Thermoelectric power generation relies on the Seebeck effect in solid materials to convert thermal energy into electricity. The theoretical energy conversion efficiency $\eta_{te}$ of a thermoelectric device operating between a hot-side temperature $T_h$ and a cold-side temperature $T_c$ is given by $$\eta_{te} = \left(1 - \frac{T_c}{T_h}\right) \frac{\sqrt{1+ZT} - 1}{\sqrt{1+ZT} + T_c/T_h}$$

where the factor $(1-T_c/T_h)$ is the Carnot efficiency, and the second factor is determined by the thermoelectric figure of merit Z and the average temperature T $[=0.5(T_h+T_c)]$ of the thermoelectric materials. The thermoelectric figure of merit (Z) is related to the material's Seebeck coefficient S, electrical conductivity $\sigma$, and thermal conductivity k via $Z=S^2\sigma/k$. Calculations based on this efficiency suggest that with a ZT between 1-2, a thermoelectric device working between 303-500 K can have an efficiency of 9-14%, while the efficiency of a thermoelectric device operating between 300-1000 K with a ZT between 1-2 can reach 17-25%.

However, achieving such working conditions in a solar-thermoelectric generator has proven elusive. Indeed, heat losses and the ability to provide adequate thermal concentration for such devices remain problematic. Accordingly, a need exists for providing improved techniques related to solar thermoelectric generation.

SUMMARY

Techniques for utilizing solar-electrical generators are discussed. Solar-electrical generators can have a radiation-capture structure and one or more thermoelectric converters. Heat produced in a capture structure via impingement of solar radiation can maintain a portion of a thermoelectric converter at a high temperature, while the use of a low temperature at another portion allows electricity generation. Thus, unlike photovoltaic cells which are generally primarily concerned with optical radiation management, solar thermoelectrics converters are generally concerned with a variety of mechanisms for heat management.

Some embodiments are directed to solar-electrical generators, which can be embodied in a flat panel configuration. In some instances, the generator can exhibit a solar energy conversion efficiency of at least about 4%. A solar-electrical generator can include a radiation-capture structure, which can be at least partially disposed in an isolated enclosure (e.g., an evacuated enclosure or an enclosure filled with a noble gas). The radiation-capture structure can have a front surface and a back surface. One or more heat diffusing elements can optionally be disposed between the front and back surfaces; the heat diffusing element(s) can have a high thermal conductivity (e.g., greater than about 20 W/m K). Either or both of the surfaces can exhibit low emissivity. For instance, the emissivity of either or both surfaces can be less than about 0.1, 0.05, 0.02, or 0.01, for wavelengths greater than about 1.5, 2, 3, or 4 microns. The low emissivity can be exhibited over a selected temperature range, such as between about 0° C. and about 500° C., or between about 50° C. and about 300° C., or between about 100° C. and about 300° C. The front surface can be adapted for exposure to solar radiation, and/or can be adapted to generate heat in response to the solar radiation exposure. For instance, the front surface can exhibit a high thermal conductivity, for instance in a lateral direction. The thermal conductivity can be greater than about 20 W/m K, or in a range from about 20 W/m K to about 400 W/m K. In some instances, the front surface is adapted to have an absorptivity to solar radiation greater than about 80%, 90%, or 95%. By way of example, such absorptivities can be achieved for solar radiation wavelengths less than about 3 microns, or solar radiation wavelengths between about 50 nm and about 3 microns.

One or more thermoelectric converters can be disposed at least partially in the enclosure. The thermoelectric converter(s) can have a high temperature end, which can be thermally coupled to the radiation-capture structure to receive at least some of the generated heat. The heat can be used to achieve a temperature differential across the converter(s). The temperature differential can be at least about 50° C., 100° C., 150° C., 200° C., or 250° C. Any one of the converters can include a p-type leg and a n-type leg, which can be coupled together by a junction. The junction can be thermally coupled to the radiation-capture structure. One or more electrically conductive leads can be coupled to the converter(s) for extracting electrical energy generated by the converter(s).

The solar-electrical generator can optionally include a support structure, which can be coupled to a low temperature end of the thermoelectric converter. The support structure can include an inner surface, which can be adapted to face the radiation capture structure's back surface. The inner surface can exhibit a low emissivity, e.g., an emissivity of less than about 0.1, for all wavelengths, or wavelengths greater than about 1.5, 2, 3, or 4 microns. The support structure can also act as a heat spreader, which can be used to remove heat from the low-temperature end of one or more thermoelectric converters. The support structure can also be thermally coupled to a heat sink.

Other embodiments are directed to solar-electrical generators that can include a radiation-capture structure, and a plurality of thermoelectric converters thermally coupled to the capture structure, where each converter can receive at least a portion of heat from the capture structure. A solar-electrical generator can exhibit an efficiency greater than about 4% or 7%. The radiation-capture structure can have a front surface adapted for exposure to solar radiation so as to generate heat, and a back surface. Either or both of the surfaces can exhibit an emissivity of less than about 0.1 for wavelengths greater than about 1, 2, or 3 microns.

The converters can be spatially arranged relative to the radiation-capture structure such that a temperature differential can be generated between the high and low temperature ends of the converters in response to incident solar radiation on the radiation-capture structure. By way of example, the temperature differential can be at least about 50° C. The low temperature end can be maintained at a temperature below about 90° C., 70° C., or 50° C. One or more of the converters can include a p-type leg and a n-type leg, where the legs can be coupled at a junction. In some cases, the junction can include a metallic structure, which can interconnect the p-type and n-type legs. At least one of the p-type leg and n-type leg can be characterized by a cross-sectional area to length ratio in a range of about 0.0001 meters to about 1 meter. A support structure can be coupled to the low temperature ends of the converters. The converters can exhibit a collective thermal conductance less than about 20% of the total thermal conductance between the radiation-capture structure and the support structure. In some instances, the radiation-capture structure can be characterized by a capture area, and the plurality of thermoelectric converters can be characterized by a converter area. In some embodiments, the ratio of the capture area to converter area can be greater than about 100, 400, or 600. The plurality of thermoelectric converters can be encapsulated in an evacuated environment relative to atmospheric pressure, and/or be embodied in a flat panel configuration.

Some embodiments of the invention are directed to solar-electrical generators, which are optionally configured in a flat panel configuration, that include at least one n-type thermoelectric leg and at least one p-type thermoelectric leg. The legs can be thermally coupled to form a junction, and can each be characterized by an axial direction. The junction can include a point of contact between a p-type leg and a n-type leg, or can include a capture structure thermally coupled to the at least one p-type leg and at least one n-type leg. The capture structure can be adapted to absorb concentrated solar radiation impinged on the structure to generate heat. One or more radiation collectors can be included to collect and concentrate incident solar radiation. The radiation collector(s) can be adapted to direct concentrated solar radiation to the junction. The legs can also be electrically coupled at the junction to form a thermoelectric converter. Each leg can be disposed relative to another leg such that an angle between the legs' axial directions lies in a range from about 0 degrees to about 180 degrees. For instance, a n-type leg and a p-type leg can be linearly aligned. In another instance, a plurality of pairs of n-type and p-type legs are assembled in pairs with each pair having one n-type leg and one p-type leg. Each pair can be linearly aligned, and each pair can have a pair junction. A plurality of radiation collectors can be adapted to direct concentrate solar radiation to the pair junctions. In some instances, pairs can share a common junction, which can have any of the traits of any other junction.

Another embodiment is directed to a solar-electrical generator that includes at least one thermoelectric converter, which can be housed in a flat panel configuration. The solar-electrical generator can include a n-type leg and a p-type leg. The legs can be aligned along a path such as a linear path, and can share a junction. The junction can be located between ends of the thermoelectric converter. One or more radiation collectors can be adapted to collect and concentrate incident solar radiation. The radiation collector(s) can also be adapted to direct the concentrated solar radiation to the junction. The junction can include a capture structure thermally coupled to the legs. The capture structure can be adapted to absorb concentrated solar radiation impinged on the structure to generate heat.

Some embodiments are directed to solar-electrical generators that include a plurality of thermoelectric converters, which can be thermally coupled together at their high temperature ends by a junction. The converters can be adapted to generate electricity when subjected to a temperature differential. Insulation material can be coupled to at least a portion of one or more converters to reduce heat transfer therefrom. The converters can be housed in a flat panel configuration, housed in a removable module, and/or encapsulated in an isolated environment. Converters can be configured to share a plane, and can optionally be aligned to be parallel to one another. One or more of the converters can include a p-type leg and n-type leg, in which the junction can include a coupling between the legs. One or more optical concentrators can be included to collect and concentrate incident solar radiation. The concentrator can direct the concentrated solar radiation to the junction. A junction can include a capture structure thermally coupled to the plurality of converters. The capture structure can be adapted to absorb concentrated solar radiation impinged on the capture structure to generate heat.

Other embodiments are directed to solar-electrical generators that utilize a barrier structure to enclose an isolated environment. The isolated environment can be an environment with a lower heat capacity than atmospheric pressure, can be an evacuated environment relative to atmospheric pressure, and/or include the use of a material exhibiting low thermal conductance (e.g., an insulating material). The barrier structure, which can have a bulb-like shape, can be at least partially transmissive to one or more wavelengths of solar radiation. One or more thermoelectric converters can be disposed in the isolated environment. A capture structure can be included within the barrier structure and thermally coupled to the converter(s). The capture structure can be adapted to absorb concentrate solar radiation from a radiation concentrator, and can generate heat. A radiation concentrator can be optically coupled to the isolated environment so as to direct solar radiation to heat at least a portion of the converter, which can facilitate generation of a temperature differential across the converter (e.g., across the high and low temperature ends of the converter). A radiation concentrator can be adapted to concentrate solar radiation to a level at least about 10 times that of incident solar radiation. The radiation concentrator can include one or more lens elements, one or more reflective elements, or one or more refractive or diffractive elements, which can each be adapted to direct solar radiation to heat the thermoelectric converter. A solar radiation tracker can be included. The tracker can be adapted to move the radiation concentrator relative to the one or more converters to maintain solar radiation exposure for heating the converter(s). A heat spreader can also be included and adapted to thermally couple to the converter(s), which can potentially remove heat from at least a portion of a converter. In some instances, one or more barrier structures can be thermally, electrically, and/or removably coupled to the heat spreader.

Some embodiments are directed to a solar-electrical generator that includes a radiation-capture structure having a radiation-absorbing surface adapted for exposure to solar radiation for generating heat, one or more thermoelectric converters, and an optical concentrator (e.g., a parabolic mirror collector), which can be optically coupled to the radiation capture structure so as to direct solar radiation thereto. The converter(s) can be thermally coupled to the capture structure to receive heat therefrom. The converters can be housed in an evacuated enclosure. The capture structure can include one or more protruding elements. For example, the protruding element can be disposed substantially orthogonal to a tangent of the capture structure surface, which can be flat in some instances. Protruding elements can be adapted to receive at least a portion of the radiation directed by an optical concentrator onto a capture structure. A protruding element can generate heat in response to solar radiation exposure, and can be thermally coupled to an end of a converter to transfer the heat thereto.

Some embodiments are directed to solar-electrical generators, which can include one or more radiation-capture structures adapted to generate heat upon absorbing solar radiation from a solar capture surface. One or more thermoelectric converters can be included, which can be adapted to be thermally coupled to the radiation-capture structure(s), and which can generate electricity upon exposure to heat from the radiation-capture structure(s). In some instances, one or more radiation-capture structures and the thermoelectric converters can be adapted as a plurality of flat panel devices, and/or housed in a plurality of evacuated environments relative to atmospheric pressure. One or more solar collectors can be adapted to collect and concentrate incident solar radiation. Each solar collector can be configured to direct concentrated solar radiation onto at least a portion of the solar capture surface. Solar collectors can be embodied as one or more lens structures or compound parabolic concentrators. As well, a plurality of solar concentrators can be configured to form a plurality of troughs, which can embodied as two-dimensional and/or three-dimensional structures. In one instance, the plurality of solar concentrators can include two or more reflective surfaces, which can be disposed at an angle relative to one another. Each reflective surface can be adapted to reflect solar radiation into a trough. As well, a cold side of at least one of the plurality of converters can be thermally coupled to at least one reflective structure, which can act as a heat sink. In another instance, the one or more radiation-capture structures and the plurality of converters can be adapted as a plurality of flat panel devices. Each of the flat panel devices can be located in a trough when solar concentrators are appropriately adapted. In another instance, a first and second radiation capture structure each have an associated capture surface. One or more solar collectors can include a first portion adapted to direct solar radiation to the first solar capture surface, and a second portion adapted to direct solar radiation to the second solar capture surface. In some embodiments, the entire structure can be encapsulated in an isolated environment, including the solar concentrators. In other embodiments, the solar concentrators can be excluded from encapsulation.

In other embodiments, a solar-electrical generator can include a radiation-capture structure adapted to generate heat upon absorbing solar radiation. A solar capture surface of the capture structure can capture solar radiation to generate heat. One or more thermoelectric converters can be thermally coupled to the radiation capture structure, and can be adapted to generate electricity upon exposure to heat from the radiation capture structure. A solar collecting transmitter can be closely coupled (e.g., in contact with) to the solar capture surface, and can be adapted to collect and concentrate incident solar radiation onto the solar capture surface. One or more protruding elements can be included with the radiation-capture structure to collect solar radiation from the solar collecting transmitter, and to capture solar radiation from multiple directions (e.g., a multiplicity of directions which cannot be captured by a flat surface).

BRIEF DESCRIPTION OF THE FIGURES

The objects and features disclosed in the present application can be better understood with reference to the drawings described herein, and the claims. The drawings are not necessarily to scale, emphasis instead generally being placed upon illustrating one or more principles of the invention. In the drawings, like numerals are used to indicate like parts throughout the various views. While the invention is particularly shown and described herein with reference to specific examples and specific embodiments, it should be understood by those skilled in the art that various changes in form and detail may be made therein without departing from the spirit and scope of the invention.

FIG. 5A is a side-view depiction of a solar-electrical generator using a lens as a solar concentrator, consistent with some embodiments of the present invention;

FIG. 5B is a side-view depiction of a solar-electrical generator using two reflective structures as a solar concentrator, consistent with some embodiments of the present invention;

FIG. 5C is a side-view depiction of a solar-electrical generator using a transmissive lens as a solar concentrator that contacts a solar capture structure, consistent with some embodiments of the present invention;

FIG. 13A provides a schematic of a prototype solar-electrical generator, consistent with some embodiments of the present invention;

DETAILED DESCRIPTION OF EMBODIMENTS

Figure 1:
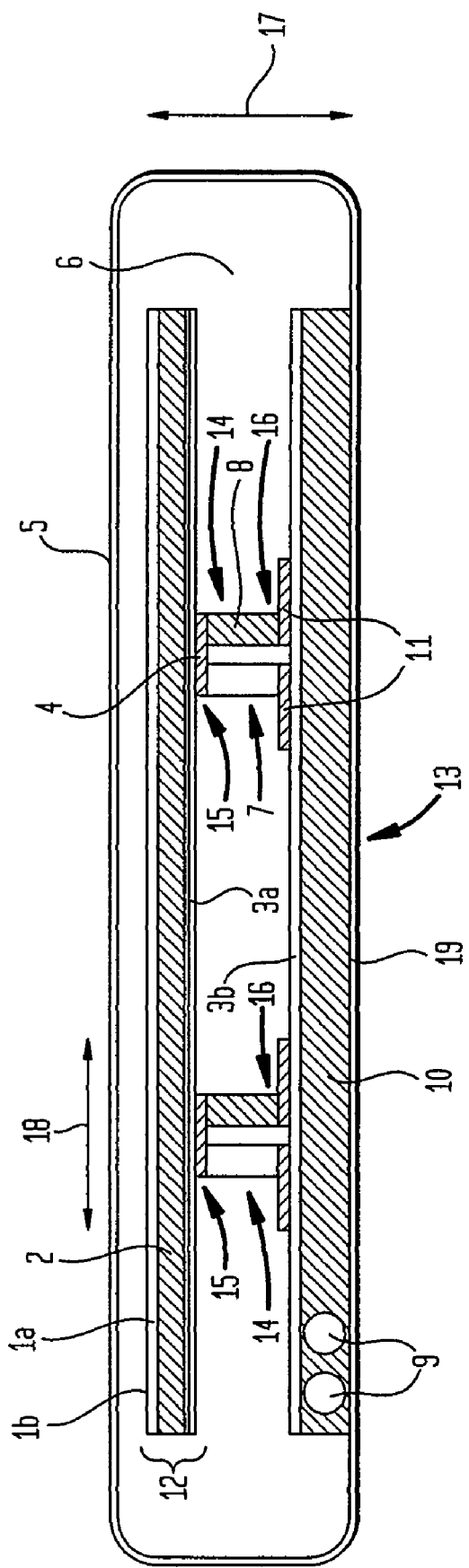
FIG. 1 is a side-view depiction of a flat-panel configuration of a solar-electrical generator module, consistent with some embodiments of the present invention.

The present invention generally provides solar thermoelectric generators that provide a high efficiency, e.g., an efficiency greater than about 4 percent, preferably greater than about 5, 6, 7, 10, 15, or 20 percent in converting solar radiation energy into electricity. In many embodiments, such high efficiencies can be achieved by a combination of features, such as the use of efficient solar radiation absorbing elements (e.g., in the form of two-dimensional absorbing layers) together with low emissivity surfaces that can minimize radiative heat loss. In many cases, the absorbing layer exhibits a high lateral thermal conductance that allows it to function as a good thermal concentrator for facile transfer of generated heat to one or more thermoelectric converters of the solar generator. In addition, in many embodiments, the various elements of the solar generator are enclosed within an isolated environment (e.g., an evacuated environment or an environment including a material having low thermal conductivity (e.g., a noble gas)) so as to minimize conductive and/or convective heat loss. Moreover, in many cases, the heat leakage across a plurality of thermoelectric converters of a solar generator is minimized via a sparse distribution of those converters. In addition, in many embodiments, the use of thermoelectric materials having high ZT values can further enhance the efficiency of a thermoelectric generator. In some cases, optical concentrators are employed to collect and concentrate solar radiation onto the high temperature ends of the thermoelectric converters to further facilitate generation of a temperature differential across them.

DEFINITIONS

Unless the context of use suggests otherwise, the following definitions apply to the terms and phrases used throughout the present application.

The terms "a" and "an" are interchangeable and are the same as the phrase "one or more."

The term "emissivity" refers the tendency of a material to emit radiation. Values of emissivity associated with a material, as utilized herein, are a ratio the emission of the material to the emission of a perfect blackbody under the same conditions. That is:

$$e = \frac{q^{(e)}}{q^{(e)}_b}$$

where e is the emissivity; $q^{(e)}$ is the total radiant energy emitted per unit area per unit time of the material; and $q^{(e)}_b$ is the total radiant energy emitted per unit area per unit time of a perfect blackbody. Accordingly, the highest emissivity of a material is 1, corresponding with a perfect blackbody.

The phrase "low emissivity" refers to the tendency of an element to exhibit small values of emissivity relative to a blackbody. Low emissivity can be characterized by values less than about 0.1, 0.05, 0.04, 0.03, 0.02, 0.01, or 0.005. As well, the low emissivity can be defined for one or more wavelengths of the electromagnetic spectrum. For example, the low emissivity can be relative to infrared wavelengths and/or longer wavelengths. In other examples, the low emissivity can be over wavelengths that are longer about 1.5, 2, 3, or 4 microns.

The term "junction" as used in conjunction with a p-type element and a n-type element refers to a coupling locale between the two elements. The coupling can refer to any combination of thermal, electrical, and mechanical coupling. The coupling can be by direct contact between elements, or can utilize one or more intermediary structures that can be attached to the elements. For example, a junction can comprise a n-type element and a p-type element in contact with one another, and having a solar capture structure attached to both elements as well, where the solar capture surface can be a good thermal conductor and/or electrical conductor. In another example, a junction between a p-type and n-type leg can include an intermediary thermal conductor where each leg is only directly contacted to the conductor. In a third example, a junction can comprise the locale where 2 n-type legs and 2 p-type legs are located. Thermal coupling can exist between the 4 legs, while electrical coupling can be limited to each p-type leg being electrically coupled to only one n-type leg. Accordingly, these examples, and other configurations, are within the scope of what can constitute a junction.

The phrase "solar radiation" refers to radiation generated from the sun. In many instances, the use of the phrase refers to radiation as received terrestrially after attenuation through the earth's atmosphere. Though solar radiation has many wavelength components, in many instances the solar radiation of interest has components having wavelengths less than about 1.5 to 4 microns or less than about 3 microns or less than about 2 microns or less than about 1.5 microns. In some instances the solar radiation of interest refers to components having a wavelength in a range of about 50 nm to about 1.5, 2, 3, or 4 microns, or about 200 nm to about 1.5, 2, 3, or 4 microns.

The term "incident" when used in conjunction with "solar radiation" refers to solar radiation that is not artificially concentrated or otherwise concentrated by unnatural or anthropogenic mechanisms. Though the "incident solar radiation" varies as a function of the sun's output and the position on the earth, in some instances we assume an incident solar radiation value between about 400 W/m$^2$ and 1500 W/m$^2$, or a single value in the aforementioned range (e.g., 1000 W/m$^2$).

The term "concentrated" when used in conjunction with "solar radiation" refers to solar radiation that has a measure of intensity above incident solar radiation. In some instances, concentrated solar radiation can refer to solar radiation concentrated to a level above 400 W/m$^2$ to above 1500 W/m$^2$.

Embodiments of the present invention are directed to a variety of designs and aspects for converting solar radiation into electricity using thermoelectric generators. A number of particular embodiments are described having particular features. In one example, a flat panel configuration using a solar capture surface having selective absorption of solar energy and low infrared emissivity is described. In another example, an encapsulated configuration is used in conjunction with a solar concentrator. It should be understood that these particular configurations, however, do not represent the full scope of the present disclosure. Any number of features from any embodiment can be combined with any number of features from any other combination of embodiments. For instance, the flat panel configuration described in the first example can be combined with a solar concentrator, or rearranged in a light bulb configuration, or both, consistent with some embodiments of the present invention. Accordingly, all such potential combinations are contemplated and within the scope of the present invention. As well, the skilled artisan will also readily ascertain a number of other modifications or changes that can be utilized with the present disclosure. Accordingly, all such modifications are further within the scope of the present invention.

Thermal Concentrator Configurations

The device illustrated in FIG. 1 exemplifies some embodiments of the invention. An example of a solar-electrical generator 13 is depicted in FIG. 1 that includes a radiation-capture structure 12 coupled to one or more (e.g., a pair) of thermoelectric converters 14. The capture structure 12 includes a radiation-absorbing layer 1a that, in turn, includes a front surface 1b that is adapted for exposure to solar radiation, either directly or via a concentrator. Although in this example the front surface 1b is substantially flat, in other examples the layer 1a can be curved. Further, although the radiation-absorbing layer 1a is shown in this example as continuous, in other cases, it can be formed as a plurality of disjoint segments. The solar radiation impinged on the front surface 1b can generate heat in the capture structure 12, which can be transferred to one end 15 of each of the thermoelectric converters 14, as discussed in more detailed below. More specifically, in this example the radiation-absorbing layer 1a can be formed of a material that exhibits high absorption for solar radiation (e.g., wavelengths less than about 1.5, 2, 3, or 4 microns) while exhibiting low emissivity, and hence low absorption (e.g., for wavelengths greater than about 1.5, 2, 3, or 4 microns).

The absorption of the solar radiation causes generation of heat in the absorbing layer 1a, which can be transmitted via a thermally conductive intermediate layer 2 to a thermally conductive back layer 3a. The thermoelectric converters 14 are thermally coupled at an end 15 to the back layer 3a to receive at least a portion of the generated heat. In this manner, the end 15 of the converters (herein also referred to as the high-temperature end) is maintained at an elevated temperature. With the opposed end 16 of the converters exposed to a lower temperature, the thermoelectric converters can generate electrical energy. As discussed in more detail below, the upper radiation absorbing layer 1a exhibits a high lateral thermal conductance (i.e., a high thermal conductance in directions tangent to the front surface 1b) to more effectively transmit the generated heat to the converters.

In some embodiments, such as depicted in FIG. 1, a backing structure 10 (also known as a support structure) is coupled to low-temperature ends 16 of the thermoelectric converters to provide structural support and/or to transfer heat away from the ends 16, i.e., acting as a heat spreader. For instance, the backing structure 10 can be thermally coupled to a heat sink, such as a cooling fluid or ambient air or other heat sink mechanism including those within the knowledge of one skilled in the art. For instance, as depicted in FIG. 12A, a backing structure 1220 is in thermal communication with a thermoelectric converter 1210. A cooling liquid loop 1250 is coupled to the backing structure 1220 to remove heat therefrom. Vacuum-tight fittings 1260 can be utilized to maintain an evacuated environment around the converter 1210. Conduit 1230 can allow heat transfer from the backing structure 1220 into the loop 1250. A heat exchanger 1240 can be employed to remove heat from the loop 1250. Other thermal conductive structures coupled to opposed ends 16 of the thermoelectric converters can also be utilized as depicted in FIG. 1. For example, as depicted in FIG. 12B, a backing structure 1225, in thermal communication with a thermoelectric converter 1210, can include one or more extensions 1226, which can be fin-like structures for increasing heat transfer away from the backing structure 1225 due to the increased surface area. It should be recognized that such backing structures with cooling features can be used with any of the embodiments disclosed herein, beyond what is depicted in FIG. 1. For instance, the use of fins can be employed on the enclosed isolated environment modules as discussed with reference to FIGS. 10A, 10B, 10C, and 11 (e.g., fins being on the support structure 1030, 1035).

For the generator 13 shown in FIG. 1, electrodes 9 are depicted for coupling the generator 13 to an electrical load. Electrically conductive leads 4, 11 are also depicted in FIG. 1, which can provide appropriate electrical coupling within and/or between thermoelectric converters, and can be used to extract electrical energy generated by the converters 14.

The solar-electrical generator 13 depicted in FIG. 1 is adapted to have a flat panel configuration, i.e., the generator 13 has at least one dimensional extent 18, representative of the solar capture surface, greater than at least one other dimensional extent 17 that is not representative of the solar capture surface. Such a configuration can advantageously increase the area available for solar radiation capture while providing sufficient thermal concentration to allow a sufficient temperature difference to be established across the thermoelectric converter to generate substantial electricity. A flat panel configuration can find practical application by providing a low profile device that can be utilized on rooftops or other man-made structures. While the device shown in FIG. 1 is depicted with a flat panel configuration, it is understood that the device of FIG. 1, and others, can be also be configured in non-flat configurations while maintaining operability.

In many embodiments, the radiation-absorbing portion of the capture structure can exhibit, at least in portions thereof, a high lateral thermal conductance, e.g., a lateral thermal conductance large enough that the temperature difference across the absorbing surface is small (e.g., less than about 100° C., 50° C., 10° C., 5° C. or 1° C.), to act as an efficient thermal concentrator for transferring the heat to the high-temperature ends of the thermoelectric converters. In some embodiments, such as depicted by the substrate layer 2 in FIG. 1, a radiation-capture structure can also exhibit a high thermal conductance in a transverse (e.g., in this case in a direction substantially orthogonal to the absorbing surface 1b) and/or lateral direction to facilitate transfer of heat from the absorbing layer to the converters. For instance, the capture structure can include a radiation-absorbing layer formed of a material with high thermal conductivity, e.g., above about 20 W/m K or in a range of about 20 W/m K to about 400 W/m K. In some embodiments, a thin film can be deposited on a substrate with such thermal conductivity values. High thermal conductance can also be achieved using thicker materials with lower thermal conductivities. Instances of materials that can be used include any combination of metals (e.g., copper-containing, aluminum-containing), ceramics, anisotropic materials such as oriented polymers (e.g., having a sufficient thermal conductance is a desired direction such as in a plane of a layer), and glasses. While the high thermal conductance properties of a capture structure are exemplified by a unitary substrate layer 2 in FIG. 1, it is understood that multiple structures, such as a plurality of layered materials, can also be used to provide the high thermal conductance property desired in some embodiments.

In some embodiments, a capture structure can include a number of components adapted to provide one or more advantageous functions. For instance, the radiation-absorbing layer 1a of the capture structure 12 shown in FIG. 1 can be adapted to selectively absorb solar radiation. For example, the radiation-absorbing layer 1a can be adapted to absorb solar radiation having wavelengths smaller than about 1.5, 2, or 3 microns, or having wavelengths between about 50 nm and about 1.5, 2, or 3 microns, or having wavelengths between about 200 nm and about 1.5, 2, or 3 microns. In terms of the fraction of impinged solar radiation that can be absorbed, the absorbing layer 1a can be adapted to exhibit an absorptivity of solar radiation that can be greater than about 70%, 75%, 80%, 85%, 90%, 95%, 96%, 97%, 98%, or 99%. For example, the radiation absorbing layer 1a can achieve such absorptivity for solar radiation wavelengths in a range of about 50 nm to about 3 microns. In some embodiments, the absorbing layer 1a can comprise one or more coatings that are applied to a substrate 2 to provide the desired selective solar absorptivity properties. One or more selective coatings can be embodied by one or more layers of hetero-materials with different optical indices, i.e., a one-dimensional photonic structure. A selective coating can also be embodied as a grating, surface texture, or other suitable two-dimensional structure. In another example, a selective coating can be embodied by alloying or compositing two or more types of materials, including nano-composites. The substrate 2 can also be part of the selective surface 1b.

In some embodiments, a capture structure's front surface, or other surface adapted to be exposed to solar radiation, can exhibit low emissivity properties over a wavelength range, e.g., at radiation wavelengths greater than about 1.5, 2, 3, or 4 microns. For example, in the above radiation capture structure 12, the front surface 1b can exhibit an emissivity at wavelengths greater than about 3 microns that is less than about 0.1, or less than about 0.05, or more preferably less than about 0.01. Such a low emissivity surface can reduce the heat loss from the solar capture structure due to radiative emission. Although such low emissivity can also reduce absorption of solar radiation wavelengths greater than about 1.5, 2, 3, or 4 microns, its effect on absorption is minimal as solar irradiance drops significantly at such wavelengths. In this exemplary embodiment, not only the front surface 1b but also a back surface 3a of the radiation capture structure 12 exhibits a low emissivity, e.g., a low emissivity at wavelengths greater than about 3 microns. The low-emissivity characteristics of the front surface 1b and the back surface 3a do not need to be identical. For example, the back surface can exhibit a low emissivity over a wider wavelength range as, unlike the front surface 1b, it does not participate in absorption of solar radiation. In some other embodiments, only one of the front and the back surfaces can exhibit low emissivity.

Furthermore, an inner surface 3b of the backing structure 10, which faces the back surface 3a of the radiation capture structure 12, can exhibit low emissivity. The low emissivity can be over all wavelengths, or can be over wavelengths greater than about 1.5, 2, 3, or 4 microns. The low emissivity characteristics of the inner surface 3b can be similar to that of the back surface 3a of the radiation capture structure, or it can be different. The combination of the low emissivity of the back surface 3a of the capture structure 12 and that of the inner surface 3b of the back structure 10 minimizes radiation heat transfer between these two surfaces, and hence facilitates generation of a temperature differential across the thermoelectric converters.

Figure 2:
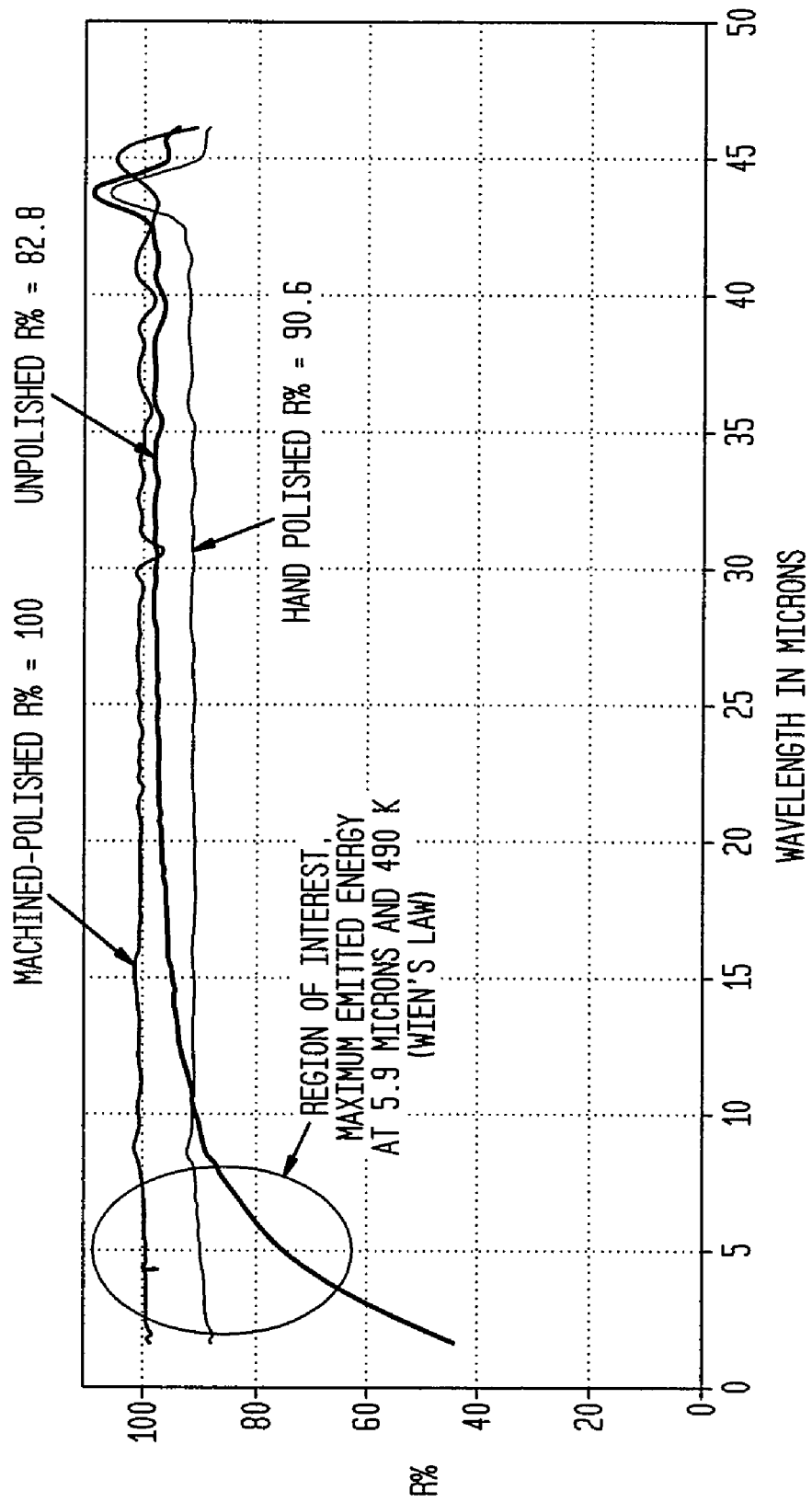
FIG. 2 depicts a graph of the reflectivity of different polished copper surfaces as a function of wavelength, allowing deduction of the emissivity, consistent with some embodiments of the present invention.

The inner surface 3b can be formed of the same material as the remainder of the backing structure 10, especially when the backing structure is formed of metal. Alternatively, the inner surface 3b can be formed of a different material than the remainder of the backing structure 10, e.g., a different metal having enhanced reflectivity in the infrared. This layer or coating can be a continuous layer, or divided into different regions electrically insulated from each other, or divided into regions electrically coupled together, which can act as interconnects for thermoelectric elements as well. Coatings with high reflectivity, such as gold, can act as low radiative emitters. In general, polished metals can exhibit higher reflectivities, and hence lower emissivities, relative to rough metal surfaces. As shown in FIG. 2, copper surfaces that are polished to better refinements result in surfaces with higher reflectivities, i.e., machine polished copper surfaces have the highest reflectivities, followed by hand polished copper surfaces, and unpolished copper surfaces. The reflectivity measurements of FIG. 2 may have a 3-5% error because the reference aluminum mirror may have reflectivity slightly lower than unity. Such high reflectivities over a wavelength range correspond to low emissivities over that wavelength range, as the sum of reflectivity and a respective emissivity is unity. As well, unoxidized surfaces tend to have lower emissivities relative to oxidized surfaces.

Using any combination of the low emissivity surfaces 1b, 3a, 3b can act to hinder heat transfer away from the capture structure 12, and thus maintain a substantial temperature gradient across the thermoelectric converters 14. When multiple low emissivity surfaces are utilized, the surfaces can have similar properties, or can differ in their emissivity characteristics. In some embodiments, the low emissivity properties of one or more structures can be exhibited over a selected temperature range such as the temperature range that the solar capture surface, or other portions of a capture structure, are subjected to during operation of the solar-electrical generator. For example, the low emissivity properties can be exhibited over a temperature range of about 0° C. to about 1000° C., or about 50° C. to about 500° C., or about 50° C. to about 300° C., or about 100° C. to about 300° C. In some embodiments, the low emissivity properties of any layer(s) can be exhibited over one or more wavelengths of the electromagnetic spectrum. For example, the low emissivity can be over a range that includes the infrared range (e.g., wavelengths greater than about 750 nm). In another example, the low emission of any layer(s) can be over wavelengths longer than about 1.5, 2, 3, or 4 microns. In other embodiments, the low emissivity of any layer(s) can be characterized by a surface having a total emissivity value less than about 0.1, less than about 0.05, less than about 0.02, or less than about 0.01 at their working temperature.

In some embodiments, a surface can comprise one or more coatings that are applied thereto in order to provide the desired low emissivity properties, as described earlier. In another instance, low emissivity can be achieved by using multilayered metallodielectric photonic crystals, as described in the publication by Narayanasywamy, A. et al, "Thermal emission control with one-dimensional metallodielectric photonic crystals," Physical Review B, 70, 125101-1 (2004), which is incorporated herein by reference in its entirety. In some embodiments, other structures can also act as a portion of the low emissivity surface. For instance, with reference to the embodiments exemplified by FIG. 1, the substrate 2 can also be part of the low emissivity surface 1b. For example, a highly reflective metal used as the substrate can be also act as a low emissivity surface in the infrared range, while one or more coatings on top of the metal can be designed to absorb solar radiation.

In some embodiments, an outer surface of the backing structure (e.g., surface 19 in the exemplary solar generator 13) in FIG. 1 can exhibit a high emissivity, e.g., for infrared radiation wavelengths, so as to facilitate radiative cooling. This can be achieved, for example, by depositing an appropriate coating layer on the outer surface of the backing structure.

In the embodiments represented by FIG. 1, among other embodiments herein, a solar-electrical generator can include a portion that is encapsulated (e.g., by a housing) such that the portion is subjected to a isolated environment 6 (e.g., evacuated relative to atmospheric pressure). Preferably, the isolated environment is selected to minimize heat transfer away from the capture structure 12. Accordingly, some embodiments utilize an evacuated environment at a pressure substantially lower than atmospheric pressure. For instance, the evacuated environment can have a pressure less than about 1 mtorr or less than about $10^{-6}$ torr. As depicted in FIG. 1, a housing 5 can encapsulate the entire device 13. At least the top surface of the housing 5 can be substantially transparent to solar radiation, e.g., having high transmissivity and low reflectivity and absorptivity to solar radiation. Potential materials that can be utilized include different types of glasses or translucent plastics. One or more coatings can be applied to one or more sides of the housing walls to impart desired properties (e.g., low reflection losses). In some embodiments, the capture structure 12 can have little to no physical contact with the housing 5 to reduce possible heat transfer away from the capture structure 12. While the embodiments represented by FIG. 1 can utilize a housing 5 that substantially encapsulates the entire solar-electrical generator structure 13, other embodiments can be configured in alternative manners. For example, the solar capture surface 1b can be unencapsulated to receive direct incident solar radiation, while the remainder of the device 13, or the region between the inner surfaces 3a, 3b, can be encapsulated to be in an evacuated environment. Housings or other structures to contain the evacuated environment can be constructed in any acceptable manner, including within the knowledge of those skilled in the art.

In alternative embodiments, the housing and enclosures discussed herein can be used to enclose an isolated environment, which can be characterized by low heat conductance (e.g., relative to the ambient atmosphere). Accordingly in place of a vacuum, an enclosed environment can include a gas with low heat capacity such as an inert gas (e.g., a noble gas such as argon). In another example, insulating materials can be included within an enclosure to limit heat transfer. For instance, the back surface of a capture surface and the inner surface of a backing structure can include a material attached thereto to provide additional insulation beyond the use of low emissivity layer. Thus, embodiments discussed herein which utilize an "evacuated environment" can also be practiced using these alternative environments.

Thermoelectric converters, such as the converters 14 depicted in FIG. 1, can generate electricity when a sufficient temperature difference is established across them. In some embodiments, a thermoelectric converter element comprises a p-type thermoelectric leg and a n-type thermoelectric leg, the legs are thermally and electrically coupled at one end, e.g., to form a junction such as a pn junction. The junction can include, or be coupled to, a radiation-capture structure, which can act as a thermal concentrator, consistent with structures discussed herein. A wide variety of materials can be utilized for thermoelectric converters. In general, it can be advantageous to utilize materials having large ZT values (e.g., material with an average ZT value greater than about 0.5, 0.8, 1, 1.2, 1.4, 1.6, 1.8, 2, 3, 4, or 5). Some examples of such materials are described in U.S. Patent Application Publication No. US 2006-0102224 A1, bearing Ser. No. 10/977,363 filed Oct. 29, 2004, and in a U.S. Provisional Patent Application bearing Ser. No. 60/872,242, filed Dec. 1, 2006, entitled "Methods for High-Figure-of-Merit in Nanostructured Thermoelectric Materials;" both of which are hereby incorporated by reference herein in their entirety.

With regard to p-type and n-type materials, such doping of materials can be performed, for example, using techniques known to the skilled artisan. The doped materials can be substantially a single material with certain levels of doping, or can comprise several materials utilized in combination, which are known in some instances as segmented configurations. Thermal electric converters can also utilize cascade thermoelectric generators, where two or more different generators are coupled, each generator operating at in a different temperature range. For instance, each p-n pair can be a stack of p-n pairs, each pair designed to work at a selected temperature. In some instances, segmented configurations and/or cascade configurations are adapted for use over a large temperature range.

Figure 3:
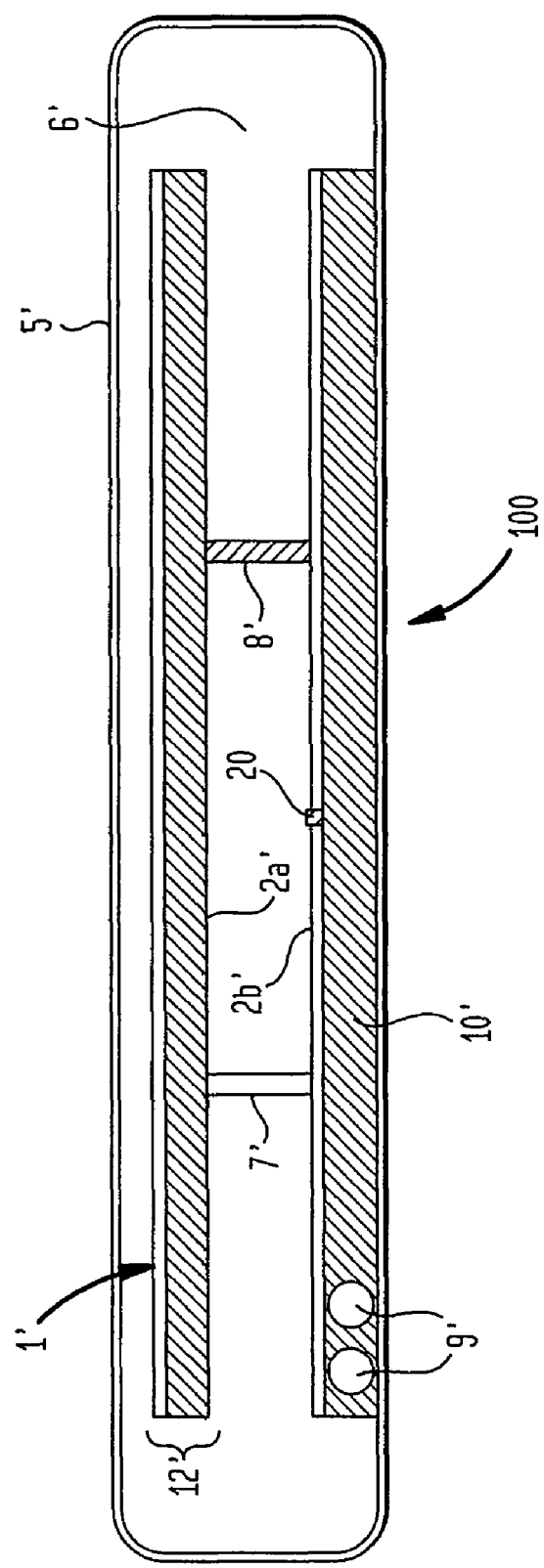
FIG. 3 is a side-view depiction of a flat-panel configuration of a solar-electrical generator module with one p-type leg and one n-type leg, consistent with some embodiments of the present invention.

The arrangements of the p-type and n-type elements can vary in any manner that results in an operational solar-electrical generator. For instance, the p-type and n-type elements can be arranged in a pattern that has periodicity or lacks periodicity. FIG. 1 presents one example where p-type and n-type legs 7, 8 are clustered closely together to form a thermoelectric converter 14. Clusters of converter legs, or individual converter legs, can be equally or unequally spaced apart. Pairs of p-type and n-type elements can be used in any number including simply one pair. Another potential configuration can space p-type and n-type elements further apart, as exemplified by the solar-electrical generator 100 shown in FIG. 3. The device 100 is similar in some respects to the solar-electrical generator 13 shown in FIG. 1, having a barrier structure 5' for providing an evacuated environment 6' relative to atmospheric pressure, a capture structure 12' with a capture surface 1', a backing structure 10', and electrodes 9'. The capture structure 12' and the backing structure 10' can be formed of a metallic material. The metallic material, which can form a layer 2b', can act as a heat spreader in the backing structure 10', and in layers 2a', 2b' to provide electrical coupling between thermoelectric structures 7', 8' on both ends of the structures 7', 8'. Note that the layer 2b' on the backing structure 10' is separated by an insulating segment 20 to prevent short circuiting of the structures 7', 8'. Accordingly, it is understood that a coating and/or layer as utilized in various embodiments herein can be continuous or discontinuous to provide desired functionality, such as a desired configuration of electrical coupling. Optionally, one or both of the metallic material 2a', 2b' surfaces can be polished to have low emissivity, consistent with some embodiments described herein. In the device 100 depicted in FIG. 3, the n-type thermoelectric element 7' and p-type thermoelectric element 8' are spaced further apart relative to what is shown in FIG. 1. When a plurality of thermoelectric converter elements are utilized in a solar-thermoelectric generator, p-type and n-type thermoelectric elements can be spaced apart (e.g., evenly) as opposed to being clustered together. For instance, considering heat losses to be due only to radiation, and using a copper material as an absorber, the spacing between legs can be as large as 0.3 m.

Figure 4:
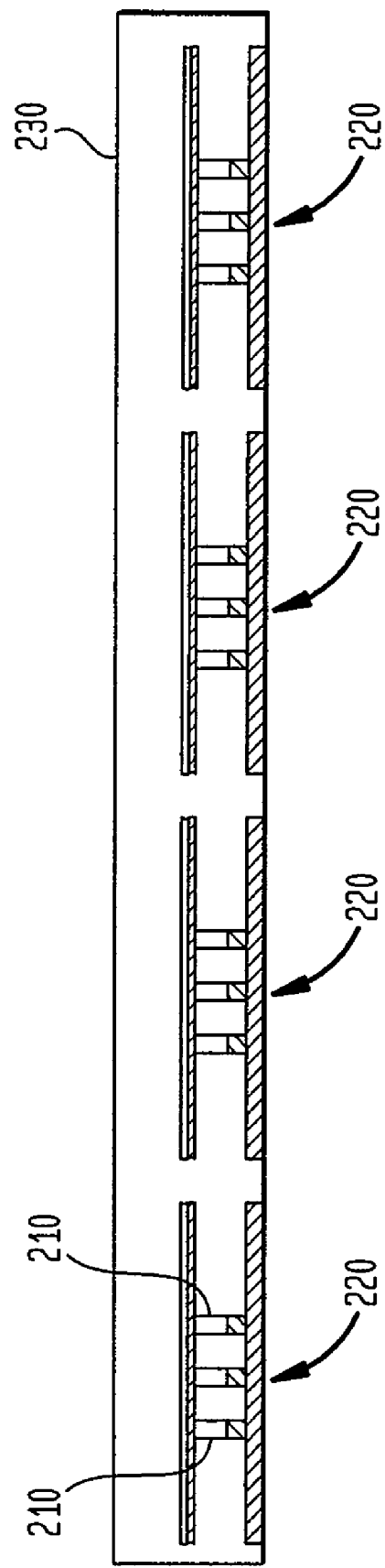
FIG. 4 is a side-view depiction of several flat-panel modules enclosed in an isolated environment, consistent with some embodiments of the present invention.

Another potential arrangement of thermoelectric converter elements is depicted in FIG. 4, where multiple thermoelectric converter elements (legs) 210 of a plurality of thermoelectric converters are clustered into groups 220 that are spaced apart. The groups 220 of thermoelectric converter elements 210 are encapsulated by a barrier 230 to enclose the ensemble in an evacuated environment. Such an arrangement can be advantageously utilized when solar radiation is non-uniformly distributed over one or more solar capture surfaces as in embodiments that utilize optical concentrators as described herein. Even if an optical concentrator is not utilized, the arrangement of converter elements could, for example, be configured to follow the path of a sunspot as it travels throughout a day over a capture surface. For the arrangement shown in FIG. 4, the groups are physically separated. It is understood, however, that a device could be embodied as a single entity with groups of converter elements sparsely separated from one another.

The spatial distribution of thermoelectric converter elements can also impact the electrical generation performance of a solar-thermoelectric generator. In some embodiments, the thermoelectric converter elements are spatially arranged such that a minimum temperature difference can be established between a high-temperature portion and a low-temperature portion of a thermoelectric converter element. The minimum temperature difference can be greater than about 40° C., 50° C., 60° C., 70° C., 80° C., 100° C., 150° C., 200° C., 250° C., 280° C., or 300° C. In some cases, such temperature differentials across the thermoelectric converters can be achieved by maintaining the low-temperature ends of the converters at a temperature below about 95° C., 90° C., 80° C., 70° C., 60° C., or preferably below about 50° C., while raising the high-temperature ends of the converters to a temperature no greater than about 350° C., when optical concentration is not employed. For low solar concentration (e.g., a concentration no greater than about 2 to about 4 times incident solar radiation), the temperature can be no greater than about 500° C. Such temperature differentials can assure that the solar-thermoelectric generator operates at a high efficiency. In particular, these temperature specification can be utilized for a thermoelectric generator that utilizes only incident solar radiation (i.e., unconcentrated radiation) and/or concentrated solar radiation.

Alternatively, or in addition, embodiments can utilize a spatial distribution of thermoelectric converter(s) that provide a limited thermal conductance between their respective ends. For instance, the total collective thermal conductance of the converters can be less than about 5%, 10%, 15%, or 20% of the total thermal conductance between a radiation-capture structure and a support structure of a solar-thermoelectric generator. Thermal conductance can also be limited by the length of a leg of a thermoelectric converter—longer legs allowing for less thermal conductance. Accordingly, some embodiments limit the ratio of the cross-sectional area to the length of a leg to help decrease thermal conductance by the leg. For example, the ratio of the cross-sectional area of a leg to the leg's length can be in a range from about 0.0001 meters to about 1 meter.

In some embodiments, the thermoelectric converters and/or legs of the converters can be distributed in a sparse manner (e.g., relative to the solar capture surface or a backing structure). Sparse distribution of thermoelectric elements can help reduce heat removal via the elements from their high-temperature ends to their low-temperature ends. The arrangements depicted in FIGS. 1 and 3 of thermoelectric converter elements provides some illustrative embodiments of sparsely distributed elements.

In some embodiments where one or more thermoelectric converter elements are sparsely distributed relative to a solar capture surface, the sparseness can be measured by the relative ratio of a solar capture area (herein "capture area") to a total cross-sectional area associated with converter elements (herein "converter area"). The capture area can be defined by the total amount of area of a selected solar capture surface available for being exposed to solar radiation to generate heat. The converter area can be defined by the total effective cross sectional area of the thermoelectric converter element(s). For instance, with respect to FIG. 1, assuming that all 4 p-type and n-type elements are geometrically similar with uniform cross-sectional areas, the "converter area" can be defined as 4 times the cross-sectional area of a p-type or n-type element, the cross-section of each element being defined by a cross-sectional surface area lying in a putative plane parallel to the capture surface 1b intersecting that element. In general, as the ratio of capture area to converter area increases, the distribution of converter elements becomes more sparse, i.e., there are fewer thermoelectric converter elements relative to the total amount of solar capture surface.

Various embodiments disclosed herein can utilize a range of capture area-to-converter area ratios. In some embodiments, a solar-electrical generator can be characterized by a ratio of capture area to converter area equal or greater than about 200, about 400, about 500, or about 600. Such embodiments can be advantageous, particularly when utilized with solar-electrical generators having a flat panel configuration that captures solar radiation without the use of a solar concentrator. In some embodiments, a solar-electrical generator can be characterized by a ratio of capture area to converter area greater than about 50, 100, 200, or 300. Such embodiments can be advantageous, particularly when utilized with solar-electrical generators which capture concentrated solar radiation (i.e., a solar concentrator is used to collect and concentrate incident solar radiation onto a solar capture surface). Though the embodiments discussed may be advantageous for the particular configurations discussed, it is understood that the scope of such embodiments are not limited to such particular configurations.

Optical Concentrator Configurations

Some embodiments disclosed below utilize solar-thermoelectric generator configurations that are adapted for use with one or more optical concentrators. An optical concentrator refers to one or more devices capable of collecting incident solar radiation, and concentrating such solar radiation. The optical concentrator can typically also direct the concentrated solar radiation to a target such as a solar capture surface. In many embodiments in which an optical concentrator is utilized, the concentrator can facilitate generation of a higher temperature differential across the thermoelectric converters, via more efficient heating of their high-temperature ends, which can result in potentially higher electrical output by the converters. An optical concentrator can also be potentially utilized with solar capture structures that have a lower thermal concentration capacity (e.g., smaller solar capture surfaces and/or capture structures that can exhibit larger heat losses) while potentially maintaining the performance of the solar-electrical generator. Though the embodiments described with respect to FIGS. 1, 3, and 4 can be adapted for use where incident solar radiation (i.e., unconcentrated) is utilized, such embodiments can also be utilized in conjunction with an optical concentrator, using any number of the features discussed herein. Similarly, some of the solar-thermoelectric generator designs discussed explicitly with reference to a solar concentrator do not necessarily require such a concentrator.

Some embodiments of a solar-thermoelectric generator that includes the use of an optical concentrator are illustrated by the exemplary devices shown in FIGS. 5A-5C. As shown in FIG. 5A, a solar-electrical generator 510 can include an optical concentrator; a radiation-capture structure; a thermoelectric converter element; and a backing structure. For the particular device depicted in FIG. 5A, the optical concentrator is embodied as a transmissive element 511, i.e., an element capable of transmitting solar radiation therethrough. Transmissive elements can be imaging or non-imaging lenses or other transmissive structures capable of concentrating and directing solar radiation. As depicted in FIG. 5A, incident solar radiation 517 can be concentrated by the transmissive element 511 into concentrated solar radiation 518 directed onto a solar capture structure 512 of the radiation-capture structure. In this example, the optical concentrator 511 comprises a convergent optical lens with the radiation capture structure 512 positioned in proximity of its focus to receive the concentrated solar radiation. The concentration of solar radiation can potentially allow the use of a smaller solar capture surface relative to designs that utilize incident solar radiation. Such capture of solar radiation can result in heating of the radiation-capture structure, which can, in turn, heat the thermally coupled ends of the n-type and p-type elements 514, 515 of the thermoelectric converter 516. The backing structure can be configured as a combination electrode/heat spreader 513 structure, which can provide electrical coupling between the n-type and p-type elements 514, 515 and thermal coupling to a heat sink to lower the temperature of the opposed ends of the converter element.

Another embodiment of a solar-electrical generator is depicted in FIG. 5B. For the solar-electrical generator 520, a set of reflective elements 521, 522 act as a solar concentrator. Reflective elements can act to redirect radiation without the radiation passing substantially through the element. Mirrors and structures with other types of reflective coatings can act as a reflective element. For the particular embodiment shown in FIG. 5B, incident solar radiation 517 is directed by structure 524 to mirrored surface 521, which is disposed in this example in proximity of the low-temperature side of the thermoelectric converter 525. The structure 524, which is optionally transparent and/or frame-like, can support the mirror and direct solar radiation downward so that heat spreading can be achieved by a lower substrate. The radiation-reflective element 521 reflects radiation incident thereon to the reflective element 522, which in turn reflects the solar radiation onto radiation capture surface 523 for heating a high-temperature end of the thermoelectric converter 525. In some cases, the reflective element 521 can have a curved shape, e.g., a parabolic, reflective surface that causes the reflective light to be concentrated onto the reflective element 522 (which can be placed, e.g., in proximity of the center of curvature of the reflective element 521). Such concentrated solar radiation is then directed via reflective element 522, which can, in some cases, also provide its own concentration of the solar radiation, onto the radiation capture structure 523.

Another alternative for an optical concentrator is utilized in the embodiment illustrated by FIG. 5C. A solar electrical generator 530 can include a solar collecting transmitter 531 for collecting and concentrating incident solar radiation. The solar collecting transmitter 531 can be closely coupled to a radiation-capture structure 532 (e.g., being in contact or having a very small space or having a thin material in between) to directly channel concentrated solar radiation to the capture structure, potentially resulting in more efficient energy transfer. There can be direct contact between the capture structure 532 and the transmitter 531. Alternatively, a thin thermal insulator (e.g., made of porous glass or a polymeric material) can be lodged between the structures 531, 532. The illustrated embodiment can also be practiced without the need for encapsulating the device in an evacuated environment because of the closer thermal coupling with the thermoelectric converter element 533. As well, when the concentration of solar energy is high (e.g., more than 10 times or 50 times incident solar radiation), convection losses are less important. It is understood, however, that the device could also be utilized in an evacuated environment.

Figure 6A:
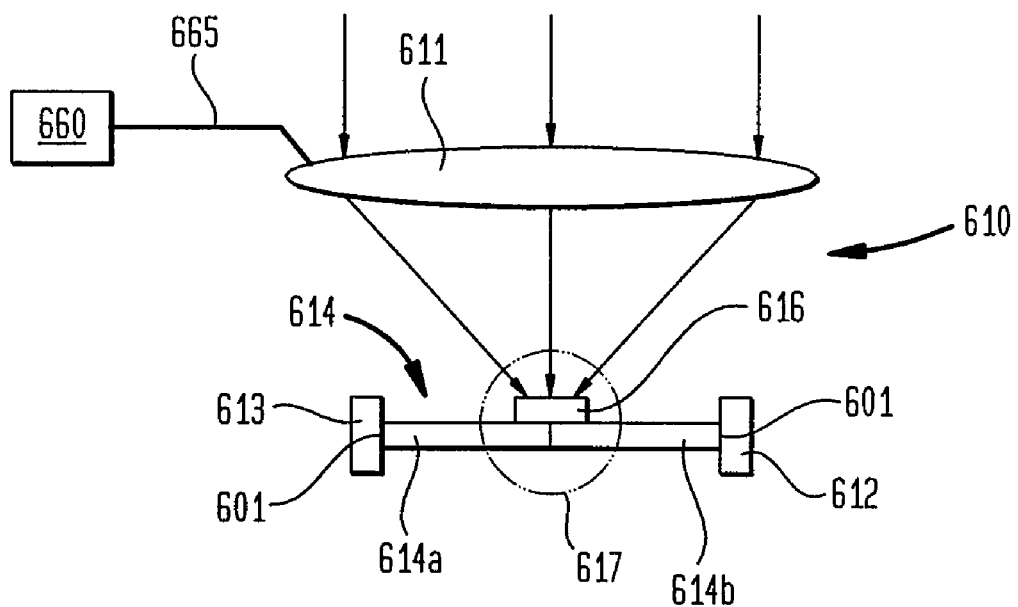
FIG. 6A is a side-view depiction of a solar-electrical generator utilizing a solar concentrator and a thermoelectric converter in a horizontal position, consistent with some embodiments of the present invention.

Some embodiments are directed to solar electrical generators in which thermoelectric converters are aligned in alternate configurations relative to those depicted in FIGS. 5A-5C. As shown in FIG. 6A, a thermoelectric converter 614 can be configured so that its n-type and p-type elements (legs) 614a, 614b are aligned along a path such as to have two ends 601. As particularly exemplified in FIG. 6A, ends 601 of the two legs define a substantially linear extent. Here the elements are a p-type leg 614a and a n-type leg 614b, each leg being characterized by an elongated (herein also referred to as axial) direction, though other leg configurations can also be utilized such as curved shapes. In this example, the legs are disposed in a common plane with their axial directions substantially co-aligned. More generally, such legs with axial directions can be disposed in a common plane at an angle relative to one another, where the angle can range from 0 degrees (i.e., co-aligned) to less than about 180 degrees, or about 45 degrees to about 180 degrees, or about 90 degrees to about 180 degrees. In other embodiments, three or more legs can be coupled at varying relative angles. In FIG. 6A, the legs 614a, 614b are aligned in a linear configuration. In particular, the legs 614a, 614b can be horizontally disposed relative to the legs shown in FIGS. 5A-5C, which are vertically-oriented. Such a configuration can provide a number of potential advantages. For instance, the horizontally-oriented legs can provide a more robust mechanical structure vis-à-vis utilizing vertically-oriented legs since the entire device housing for the thermoelectric converter can have a lower profile. The lower profile configuration can aid in the construction of flat-panel configurations for solar-electrical generators and/or providing a smaller volume for encapsulation when such embodiments further utilize an evacuated environment, as discussed herein.

As depicted in FIG. 6A, the elements 614a, 614b share a junction 617 located between the ends 601 of the thermoelectric converter 614. For the embodiment shown here, the junction 617 includes a thermal collector 616 acting as a capture structure, though the junction can also include other types of elements for providing thermal and/or electrical coupling between the elements 614a, 614b. Alternatively, the p-type and n-type elements 614a, 614b can be in physical contact to produce the junction. One or more radiation collectors can be used to collect and capture incident radiation, and direct the concentrated radiation onto the thermoelectric converter so as to heat the junction. For the specific case of FIG. 6A, a lens 611 directs concentrated solar radiation onto the thermal collector 616, which can result in heat generation in the collector 616. As the thermal collector 616 is thermally coupled with the junction 617, it transfers heat generated therein (or at least a portion of such heat) to the junction, thus subjecting the junction 617 to an elevated temperature. A thermal collector 616 can also be a solar radiation absorber, while having low emissivity, as described with respect to other embodiments herein. An example of such a thermal collector material is one or more carbon graphite layers. Further, structures 612, 613 can act as heat spreaders to keep the coupled ends of the elements 614a, 614b at a lower temperature, allowing the thermoelectric converter 614 to generate electricity.

Figure 6B:
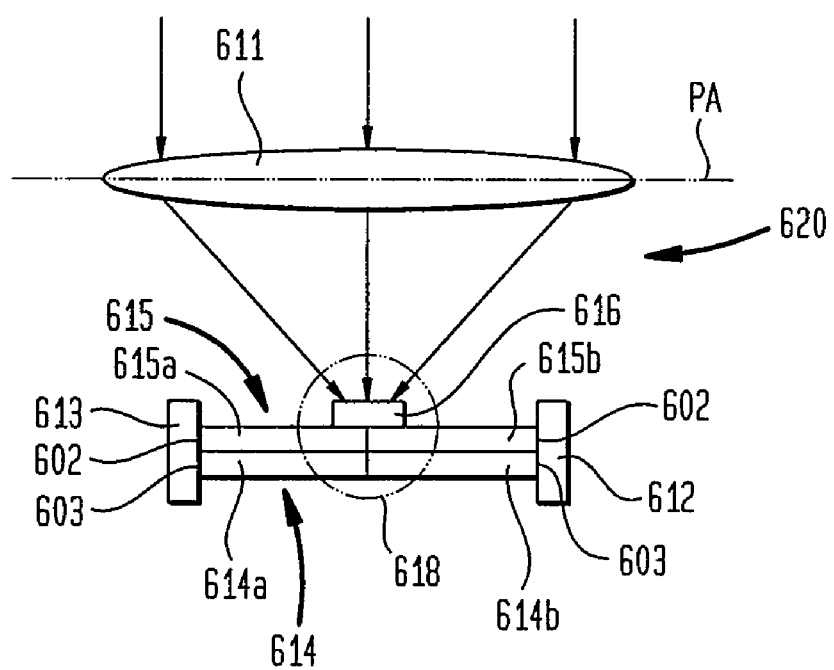
FIG. 6B is a side-view depiction of a solar-electrical generator utilizing a solar concentrator and two thermoelectric converters in a horizontal position stacked on top of each other, consistent with some embodiments of the present invention.
Figure 6C:
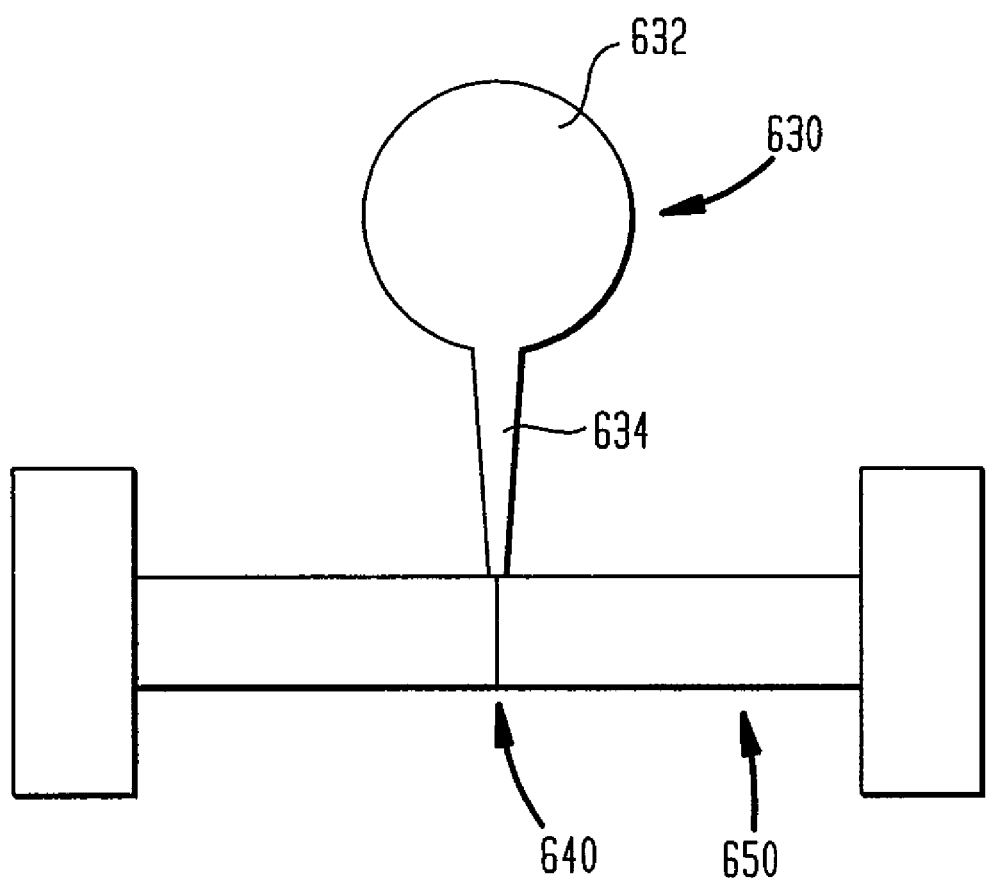
FIG. 6C is a side-view depiction of a solar-electrical generator utilizing a solar concentrator in a mushroom shape and a thermoelectric converter in a horizontal position, consistent with some embodiments of the present invention.

It is understood that a wide variety of geometries can be employed as a capture structure, which can act as a thermal concentrator for directing thermal energy to a junction, as shown in FIGS. 6A and 6B. In some embodiments, it can be advantageous to utilize a capture structure that has a relatively large capture area relative to the junction where thermal energy is directed. FIG. 6C schematically shows one example of a capture structure as a thermally conductive element 630 that can be thermally coupled to the junction 640 of the thermoelectric converter 650 to transfer heat generated therein due to exposure to solar radiation to the junction 640. The thermally conductive element 630 has a mushroom-like shape with a radiation-capture portion 632 that can generate heat in response to exposure to solar radiation. Other shapes can also be utilized. A thermally conductive stem 634 adapted for thermal coupling to the junction 640 provides a thermal path between the radiation-capture portion 632 and the junction 640. Other examples of capture structures with larger capture areas for solar radiation capture relative to the junction areas can also be employed.

While the device 610 shown in FIG. 6A utilizes one thermoelectric converter, it should be understood that other embodiments can utilize a plurality of thermoelectric converters. One example of such a configuration is shown in FIG. 6B, which depicts two thermoelectric converters 614, 615 in a solar-electrical generator 620. Each of the converters 614, 615 can have a p-type leg 614a, 615b and a n-type leg 614b, 615a, where the corresponding p and n-type legs are thermally and electrically coupled. The converters 614, 615 share a common junction 618 that includes a thermal conductor 616. In this embodiment, the p-type and the n-type legs of the two converters are disposed substantially in a common plane. The junction 618 is located between the ends 602, 603 of the converters 615, 614. Optical concentrator 611 directs solar radiation onto the thermal conductor, and hence the junction 618 to heat ends of the converter legs 614a, 614b, 615a, 615b, i.e., the high temperature ends of the converters 614, 615. In this example, the optical concentrator comprises a convergent optical lens which is positioned relative to the thermoelectric converters 615, 614 such that its principal axis PA is substantially parallel to the common plane in which the p-type and n-type thermoelectric legs are disposed. The stacked and horizontal orientation of the converters 614, 615 can act to aid in the design of low-profile, more mechanically-robust solar-electrical generators.

For the various elements depicted in FIGS. 5A, 5B, 5C, 6A, 6B, and 6C such elements can include any of the features or variations associated with such elements as described with respect to various other embodiments of the present invention. Accordingly, the use of one or more low emissivity surfaces, configuring the devices in a flat panel configuration, encapsulating devices or portions thereof in an isolated (e.g., evacuated) environment, and spatially distributing thermoelectric converters can be implemented in any combination, for example.

As well, the embodiments shown in FIGS. 5A, 5B, 5C, 6A, 6B, and 6C can utilize additional components to enhance solar-electrical generator performance. For instance, as shown in FIG. 6A, in some embodiments, a solar tracking apparatus 660 can be included to maintain incident solar radiation upon one or more solar concentrator elements 611. Typically, the solar tracking apparatus can include a mechanism 665 for moving one or more elements of a solar concentrator 611 to track the sun's motion to help enhance solar capture. Alternatively, a solar tracking apparatus can also be used in systems without a solar concentrator. In such instances, a thermoelectric module can include a solar capture surface in which the tracking apparatus can move the capture surface to maintain incident solar radiation impingement on the surface. While some of the embodiments discussed herein can be configured to be used without a tracking device, it is understood that solar tracking devices can generally be used in conjunction with any of the embodiments disclosed herein unless explicitly forbidden.

Other embodiments of the invention are directed to solar-electrical generators that utilize a plurality of solar collectors which can concentrate solar radiation in a plurality of regions to provide heating to one or more solar capture structures. Some embodiments utilize a plurality of reflective solar collectors such as exemplified in FIG. 7. As depicted, a plurality of solar collectors 710, 720 are embodied as a set or mirrored surfaces 713, 715, 723, 725 configured to form a plurality of troughs 711, 721. Separate thermoelectric modules 717, 727 can be located in the troughs 711, 721. The mirrored surfaces 713, 715, 723, 725 can reflect solar radiation into the troughs 711, 721 such that the solar radiation impinges upon a capture surface of each of the thermoelectric module 717, 727. This arrangement of the thermoelectric converters and optical concentrators can be extended beyond that shown in the figure. In this case, two slanted reflective surfaces 715, 723 of the solar collectors 710 and 720, which face one another, funnel optical energy onto a radiation-capture surface of the thermoelectric converter 717. Similarly, many of the other thermoelectric converters can receive concentrated solar radiation via reflection of the radiation from two opposed reflective surfaces of two optical concentrators. Such a configuration can be used to provide low level solar radiation concentration (e.g., a solar flux of greater than one and up to about 4 times incident solar radiation). The solar collectors can be adapted such that as the sun and earth move relative to one another, a substantial amount of solar radiation can continually be collected in the troughs. Accordingly, the use of a solar tracker can be avoided in some applications of these embodiments, though in other applications such a tracker may be utilized. In an alternative embodiment, the V-shaped collector of FIG. 7 can be utilized as a secondary collector, where a large solar concentrator with a solar tracking device is used to project solar radiation onto the V-shaped collector. As well, a V-shaped collector can be reduced to be fitted into an isolated environment surrounded by a barrier structure.

Figure 7:
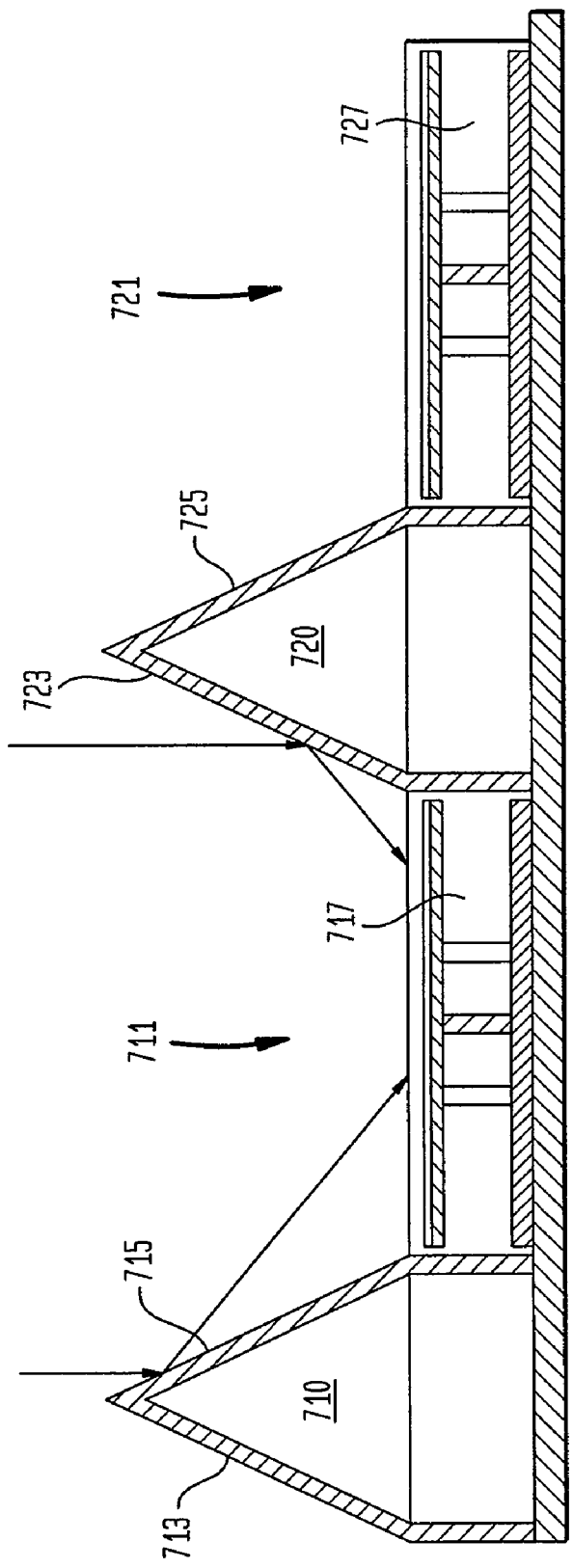
FIG. 7 is a side-view depiction of a solar-electrical generator utilizing a plurality of reflective surfaces arranged in a trough design as a plurality of solar concentrators, consistent with some embodiments of the present invention.

The plurality of thermoelectric modules shown in FIG. 7 are embodied as flat panel devices each encapsulated in an evacuated environment. It is understood that other modular configurations, including any of the devices or features of devices disclosed herein, can be utilized instead. In some embodiments, however, the module can be chosen to be consistent with the solar flux that can be generated by such solar collectors (e.g., modules that operate using solar radiation fluxes from 1 to about 4 times incident solar radiation values, which can depend upon collection angles). It is also understood that while FIG. 7 depicts a two-dimensional arrangement, troughs can also be embodied in a three-dimensional arrangement, where each trough is more pit-like, allowing for a three-dimensional distribution of solar-electrical modules.

Figure 8A:
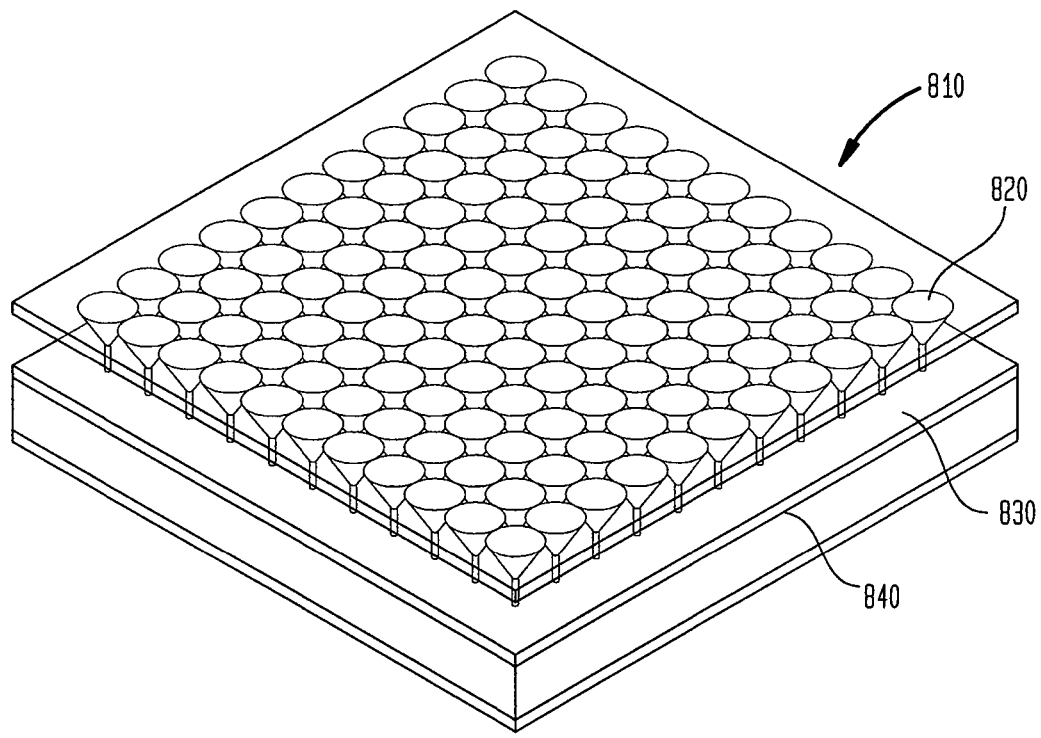
FIG. 8A is a perspective view depiction of a solar-electrical generator utilizing a plurality of lens structures as a plurality of solar concentrators, consistent with some embodiments of the present invention.
Figure 8B:
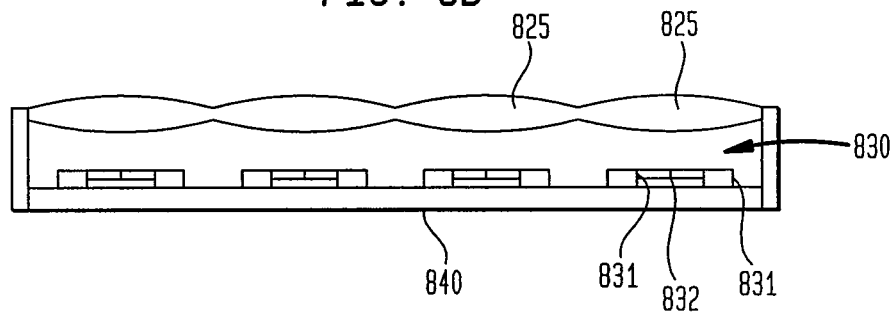
FIG. 8B is a side view depiction of the solar-electrical generator shown in FIG. 8A.

Other embodiments of a solar-electrical generator utilizing a plurality of solar collectors can be configured using different types of solar collectors in different arrangements. For instance, a solar-electrical generator 810 is depicted in a perspective view in FIG. 8A and in a partial cross-sectional view in FIG. 8B. An assembly 820 of solar collectors embodied as a plurality of lens structures 825 serves to capture incident solar radiation. Each of the lens structures 825 can concentrate and direct solar radiation onto a thermoelectric module 830, where for each lens structure 825 a respective module 830 is provided. Each module 830 can be embodied in any number of configurations, including any of the configurations described in the present application. As depicted in FIG. 8B, each module 830 can be configured as a set of thermoelectric converters in a horizontal-orientation, as shown in FIGS. 6A and 6B. Accordingly, the lens structures 825 can be adapted to direct solar radiation onto the corresponding junctions of the modules 830. The modules 830 can be coupled to a backing structure 840, which can optionally be configured as a heat sink to keep ends 831 of the converters at a lower temperature relative to the high temperature ends 832. Like the embodiments exemplified by FIG. 7, the use of the multiple lens structures 825 can direct solar radiation to a specific location, and potentially alleviating the need for a solar tracking device.

Figure 9:
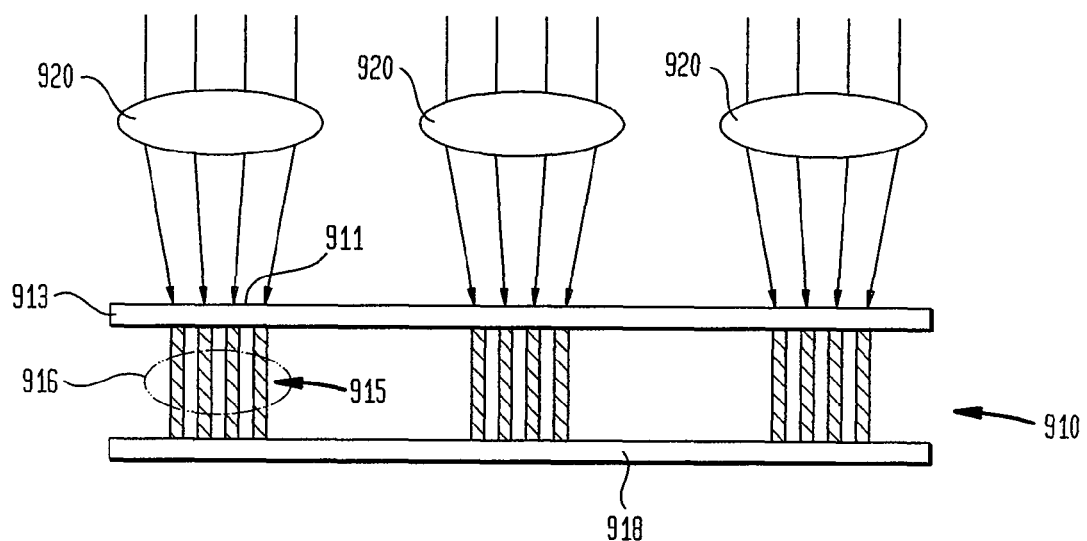
FIG. 9 is a side-view depiction of a solar-electrical generator utilizing a plurality of lens structures as a plurality of solar concentrators and a single solar thermoelectric generator having grouped converters, consistent with some embodiments of the present invention.

While FIGS. 7 and 8 exemplify some exemplary embodiments in which a plurality of concentrators are used with a plurality of thermoelectric modules, it should be understood that the concentrators can also be configured to be used with a single thermoelectric module. One example of such a configuration is shown in FIG. 9. A set of solar collectors exemplified as lens structures 920 can be used to capture and concentrate incident solar radiation onto a thermoelectric module 910, which can be used to create electricity from the concentrated solar radiation. Such a module can include any number of the features described with respect to the module depicted in FIG. 1 (e.g., low emissivity surfaces, flat panel configuration, and/or evacuated environment). For the particular configuration depicted in FIG. 9, the module 910 can include groupings 916 of p-type legs and n-type legs 915 that are spaced apart relative to a capture structure 913. Each lens structure 920 can be adapted to direct concentrated solar radiation onto a portion 911 of the capture structure solar collection surface, where the portion can correspond with the proximate location of a grouping 916 of legs 915. It is understood that variations in the design of the system depicted in FIG. 9 (as is the case for FIGS. 7 and 8) can be employed consistent with embodiments of the present invention. For example, a different configuration of solar collectors (e.g., using properly configured reflective surfaces) could be employed instead of the lens structures. One optical concentrator can used with respect to the module shown in FIG. 9 as well. In such an instance, the focus/concentrated light spot can move following the sun if the device does not utilize tracking. One thermoelectric unit in the set can produce higher efficiency due to reduced size, and hence a lower radiation loss.

Figure 10A:
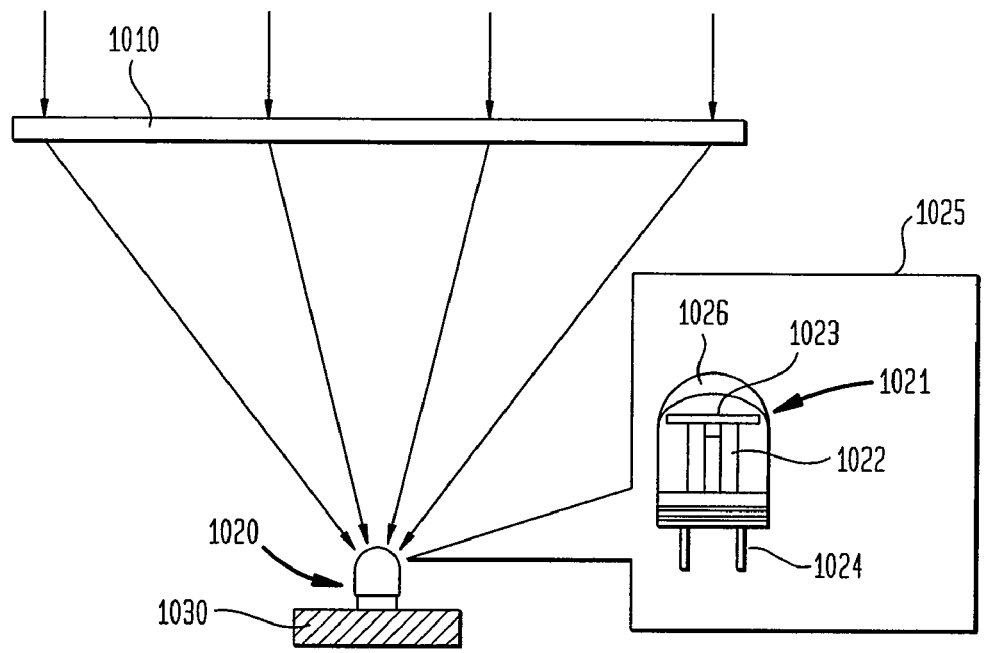
FIG. 10A is a side-view depiction of a solar-electrical generator using a flat Fresnel lens as a solar concentrator and a barrier structure enclosing a thermoelectric converter in an isolated environment, consistent with some embodiments of the present invention.
Figure 10B:
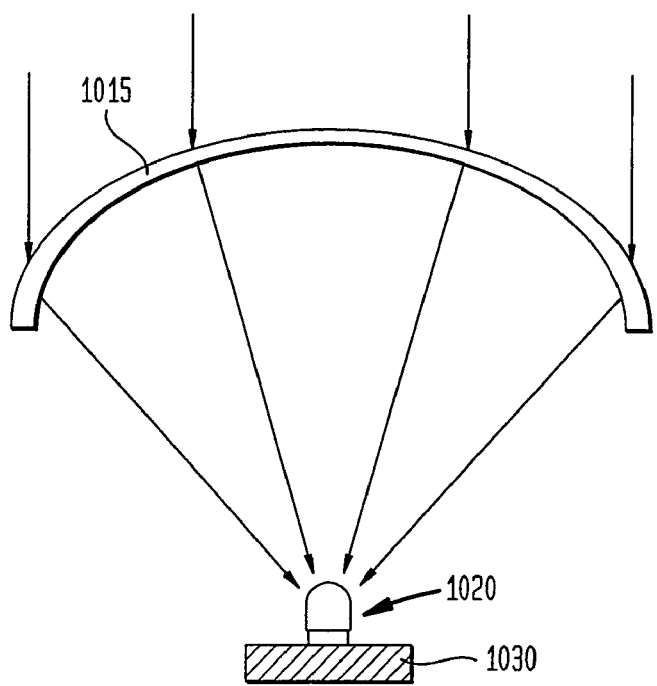
FIG. 10B is a side-view depiction of a solar-electrical generator using a curved Fresnel lens as a solar concentrator and a barrier structure enclosing a thermoelectric converter in an isolated environment, consistent with some embodiments of the present invention.

While the embodiments depicted in FIGS. 7-9 have shown the use of a variety of thermoelectric module configurations with solar concentrators, other module designs are also possible. One alternative module design and its use is depicted in FIGS. 10A and 10B. As shown in FIG. 10A, a solar collector 1010, which can be embodied as a Fresnel lens or some other type of diffractive element, is used to focus concentrated solar radiation onto a thermoelectric module 1020, which can be thermally coupled to a heat spreader 1030 (or more generically coupled to a support structure). Other types of potential solar collectors include using one or more lens elements, reflective elements, and/or refractive elements. In some embodiments, the thermoelectric module 1020 can be removably coupled (e.g., mechanically, thermally, and/or electrically) to the heat spreader 1030. Accordingly, the module 1020 can be replaced easily into the heat spreader for enhanced maintenance of such a system.

A more detailed view of the thermoelectric module 1020 is provided in the blow up box 1025 in FIG. 10A. The module 1020 can include a barrier structure 1021 (in this case a bulb-like structure) which encloses the module 1020 in an isolated environment. The isolated environment can be an evacuated environment relative to atmospheric pressure, or can comprise an atmosphere which has low thermal conductance relative to the ambient atmosphere. Examples can include the use of gases having low heat capacities such as an inert gas. Thermally insulating materials can also be incorporated within the barrier structure 1021 to reduce heat loss from high-temperature ends of the thermoelectric module. The barrier can be adapted to be at least partially transmissive to solar radiation, where the barrier can include any number of features as described for the encapsulation with respect to FIG. 1. For the particular configuration shown in FIG. 10A, the barrier structure 1021 forms at least part of a bulb-like enclosure; other geometrical configurations are also contemplated. The barrier structure 1021 can optionally include a lens structure 1026, which can further direct and/or concentrate solar radiation impinging on the barrier structure 1021. Within the enclosure, a radiation-capture structure 1023 can be coupled to the legs 1022 of a thermoelectric converter. Solar radiation impinging on the barrier structure 1021 can be directed onto the capture structure to generate heat, and keep one end of the legs 1022 at a relatively high temperature. Electricity generated by the legs 1022 of the converter can be coupled to an electrical load via electrodes 1024.

Thermoelectric modules that utilize the barrier structure exemplified in FIG. 10A can afford a number of advantages. The module can be configured compactly, having a reduced volume (e.g., relative to the volume of a larger flat panel configuration) to facilitate ease of maintaining an evacuated environment. The use of a solar concentrator (e.g., solar concentrators that provide a high degree of concentration such as greater than about ten times incident solar radiation) can allow the use of smaller capture structures for thermal concentration, which enables the use of smaller volumes. As mentioned previously, such compact structures can also be modular in nature, allowing ease of replacement of such modules. This aspect can be particularly advantageous in configurations that include a multiplicity of modules. For instance, the system depicted in FIGS. 8A and 8B can utilize the encapsulated module 1020 of FIG. 10A instead of the module 830. This can provide for ease of maintenance if one module becomes broken. It is understood, however, that the module 830 of FIGS. 8A and 8B can also be contained in a replaceable modular configuration that is encapsulated.

Figure 10C:
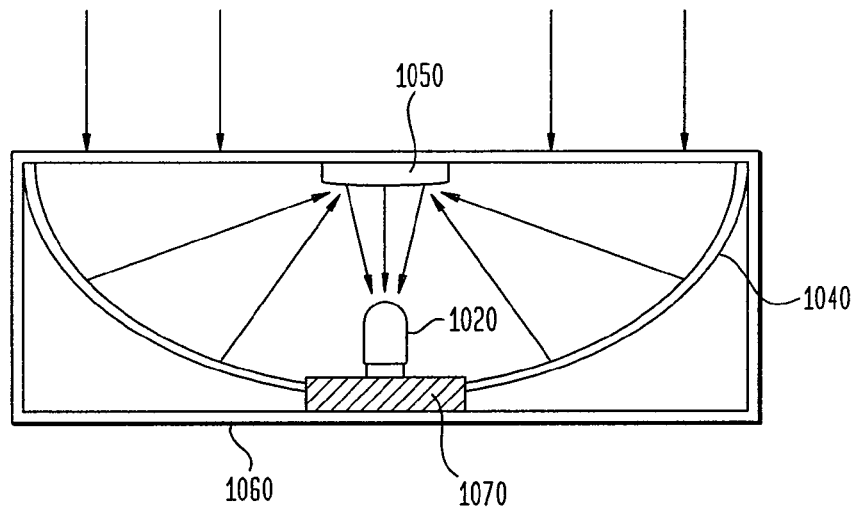
FIG. 10C is a side-view depiction of a solar-electrical generator using two reflective surfaces to concentrate solar radiation onto a barrier structure enclosing a thermoelectric converter in an isolated environment, consistent with some embodiments of the present invention.

A variety of other configurations are contemplated beyond what is shown in FIG. 10A, including those modifications apparent to one skilled in the art. For instance, the Fresnel lens concentrator can be configured as a flat structure 1010 as depicted in FIG. 10A, or as a structure having a curve 1015 as shown in FIG. 10B. As well, other types of optical concentrators beyond Fresnel lenses can be used, such as other types of diffractive elements. As shown in FIG. 10C, a solar-electrical device 1060 can utilize two reflectors 1040, 1050 as a solar collector direct solar radiation to the thermoelectric module 1020, akin to what is shown as described with respect to FIG. 5B. The heat spreader 1070 can be thermally coupled to the environment to provide a heat sink. As well, encapsulated designs can utilize a solar tracker, as discussed herein, to maintain solar radiation on a portion of the encapsulated structure. Such designs can aid in maintaining a particular level of concentrated solar radiation on the encapsulated structure (e.g., at least 10 time incident solar radiation). All these variations, and others, are within the scope of the present disclosure.

Figure 11:
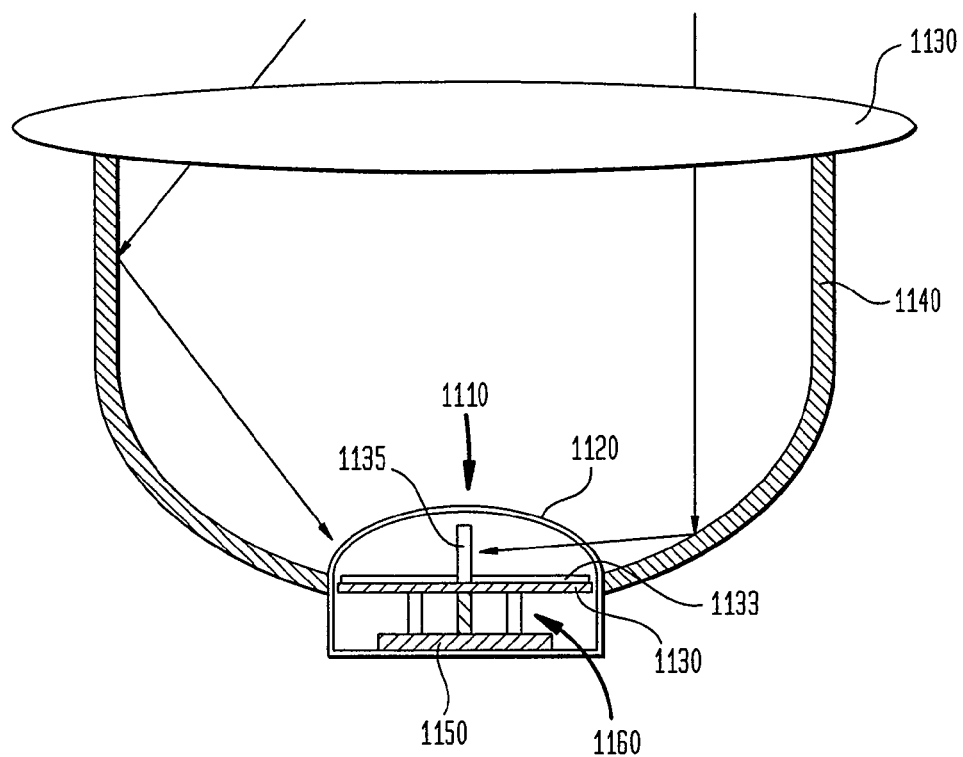
FIG. 11 is a side-view depiction of a solar-electrical generator using a parabolic reflective surface to concentrate solar radiation onto a barrier structure enclosing a converter coupled to a capture structure having a protruding element, consistent with some embodiments of the present invention.
Figure 12A:
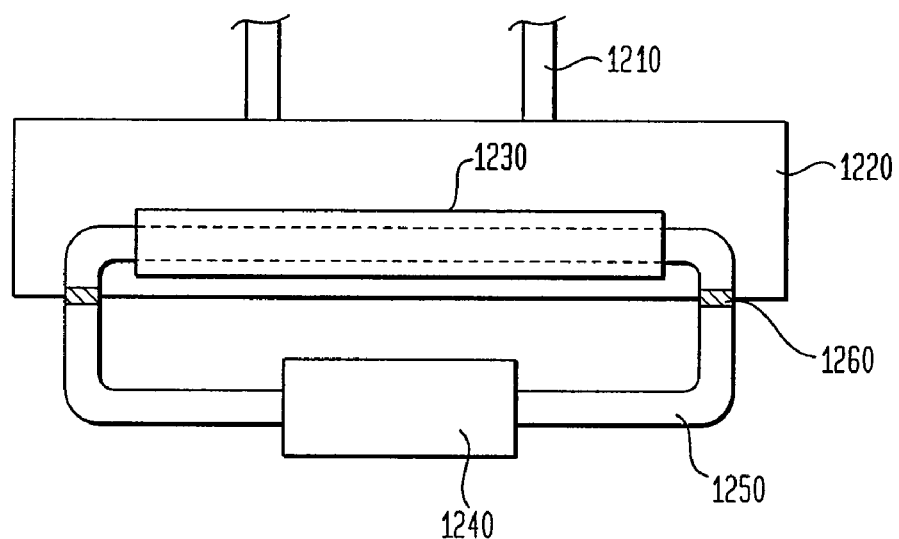
FIG. 12A is a side-view depiction of a support structure coupled to a fluid-based heat transfer system for removing heat from the support structure, consistent with some embodiments of the present invention.
Figure 12B:
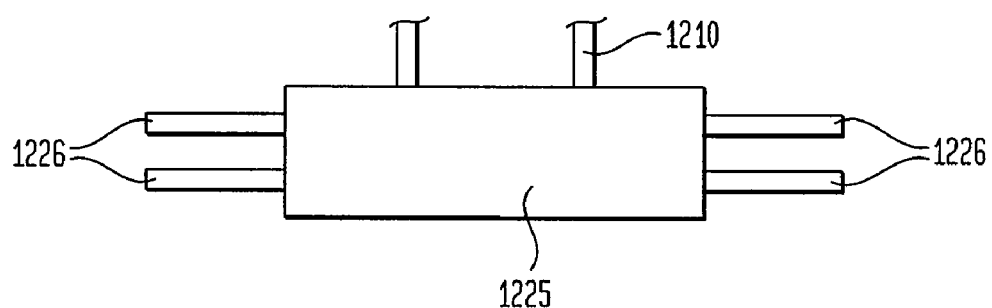
FIG. 12B is a side-view depiction of a support structure with extensions for increasing heat transfer away from the support structure, consistent with some embodiments of the present invention.

Another modular configuration for use with the various solar-electrical embodiments discussed herein is depicted in FIG. 11. A solar concentrator for use in directing and concentrating solar radiation can include a reflective element 1140 (e.g., a parabolic mirror). Another optical element 1130 (e.g., a convergent lens) can also be used to direct incident solar radiation toward the reflective element 1140. The reflective element 1140 can, in turn, concentrate and direct the solar radiation incident onto the thermoelectric module 1110. The module 1110, which can optionally be encapsulated in an enclosure 1120 to provide an evacuated environment relative to atmospheric pressure, can include a radiation-capture structure 1130, which can include one or more surfaces for absorbing solar radiation. The capture structure can generate heat upon exposure to solar radiation. The capture structure can include one or more protruding elements 1135 that can be adapted to receive some of the solar radiation reflected by the reflective element 1140, and can further be configured to generate heat by absorbing at least a portion of the solar radiation spectrum. For example, as depicted in FIG. 11, the protruding element 1135 is substantially perpendicular to the flat surface 1133 of the capture structure 1130. Accordingly, the parabolic mirror need not be configured to direct light only to a flat surface, but can also direct light on the protruding surfaces. Such a design can be advantageous since it can provide flexibility on the requirements on solar collector designs, and can increase the heat generating capacity of a capture structure. A protruding element can allow a capture structure to absorb solar radiation from a multiplicity of angle and directions (e.g., including directions that cannot be captured by a single flat surface). One or more thermoelectric converters 1160 can be coupled to the capture structure 1130, with one end of the converter thermally coupled to the capture structure and another end coupled to a heat spreader 1150. The protruding element can be composed and designed in accord with any of the capture structures disclosed in the present application (e.g., a metal or other material with high selective solar absorbance and/or low emissivity to infrared light). As well, the design of a module with a protruding element can be in a removably couplable module as discussed with respect to FIGS. 10A-10C.

The following example is provided to illustrate some embodiments of the invention. The example is not intended to limit the scope of any particular embodiment(s) utilized, and is not intended to necessarily indicate an optimal performance of a thermoelectric generator according to the teachings of the invention.

Figure 13B:
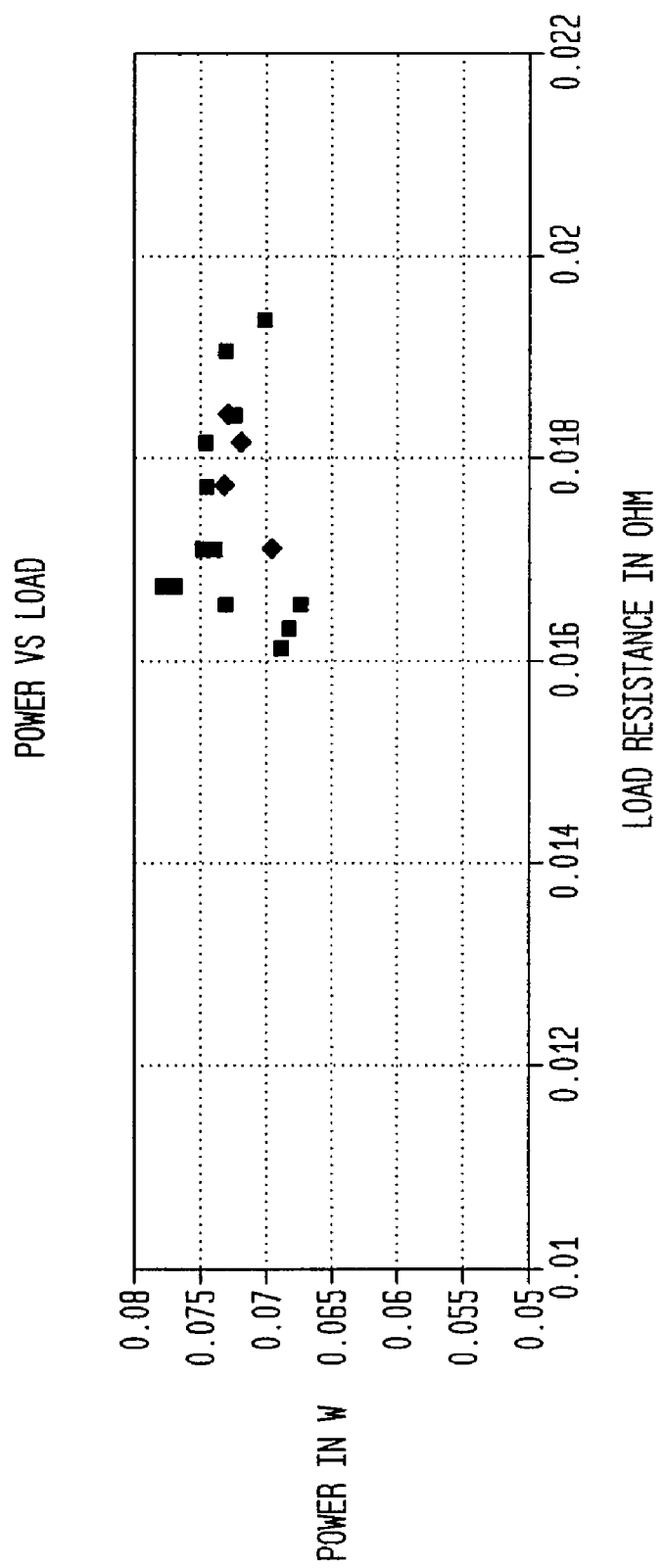
FIG. 13B provides a graph of power versus load resistance tested in the prototype solar-electrical generator represented in FIG. 13A.
Figure 13C:
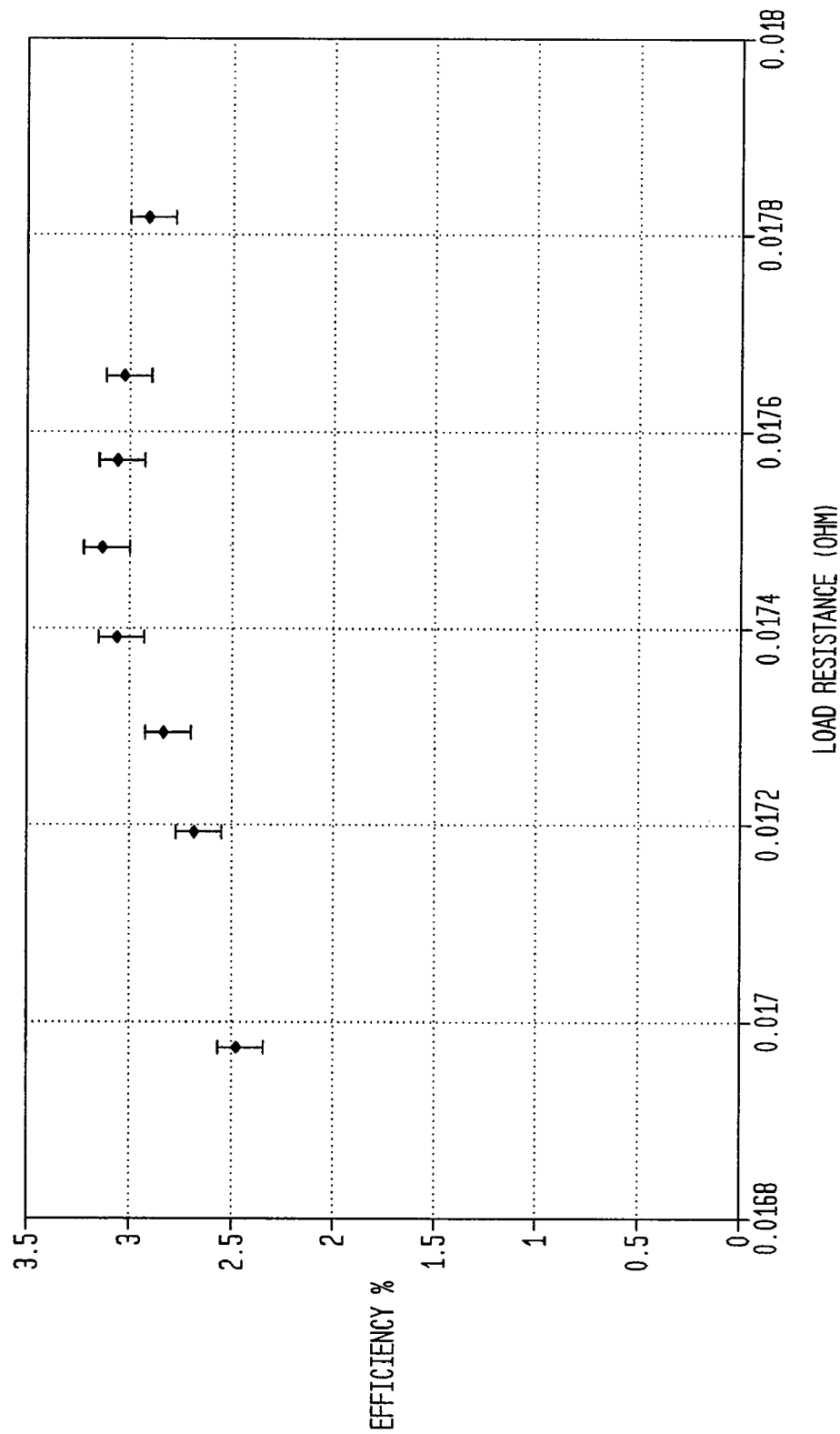
FIG. 13C provides a graph of efficiency versus load resistance tested consistent with the data shown in FIG. 13B.

FIG. 13A illustrates a prototype of a thermoelectric generator and its performance. FIG. 13A is a schematic of the prototype. The generator made of one pair of p-type and n-type commercially available thermoelectric elements. A thickness of ~1 mm is utilized in our thermoelectric elements. The thickness of the legs can be from 20 microns and up to 5 mm. A selective absorber made of copper is attached to the top of the legs and also serves as an electrical interconnect. The experimental apparatus was tested inside a vacuum chamber. The power output from the pair of legs under ~1000 $W/m^2$ illumination is shown in FIG. 13B, and the efficiency is shown in FIG. 13C. This prototype did not use parallel plates and did not attempt to increase the reflectivity of the backside of the absorber. By taking these measures, among others which are disclosed in the present application, higher efficiencies can potentially be achieved.

While specific embodiments of the subject invention have been discussed, the above specification is illustrative and not restrictive. Many variations of the invention will become apparent to those skilled in the art upon review of this specification. The full scope of the invention should be determined by reference to the claims, along with their full scope of equivalents, and the specification, along with such variations. Unless otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in this specification and attached claims are approximations that may vary depending upon the desired properties sought to be obtained by the present invention.

What is claimed is:
1. A solar-electrical generator, comprising:
   an evacuated housing having at least a top surface which is transparent to solar radiation;
   a radiation-capture structure having a front surface and a back surface, said front surface being adapted for exposure to solar radiation so as to generate heat;
   at least one thermoelectric converter thermally coupled to said structure at a high temperature end thereof to receive at least a portion of said generated heat such that a temperature differential is achieved across the at least one thermoelectric converter; and
   a backing structure located in the evacuated housing;
   wherein said backing structure contacts a low-temperature end of said thermoelectric converter;
   wherein said entire backing structure is located entirely in the evacuated housing wherein said housing is made from glass or plastic which is transparent to the solar radiation;
   wherein said radiation-capture structure does not physically contact the evacuated housing except indirectly through the at least one thermoelectric converter;
   wherein said radiation-capture structure is characterized by a capture area of the front surface adapted to be exposed to solar radiation and the plurality of thermoelectric converters are characterized by a converter area, a ratio of capture area to converter area being greater than about 100;

wherein the solar-electrical generator is configured such that the entire radiation capture structure is exposed to solar radiation which is not concentrated or concentrated less than 4 times; and wherein the radiation-capture structure directly physically contacts an end of the at least one thermoelectric converter.

2. The solar-electrical generator of claim 1, wherein the ratio of capture area to converter area is greater than about 300.

3. The solar-electrical generator of claim 1, wherein the ratio of capture area to converter area is greater than about 500.

4. The solar-electrical generator of claim 1, wherein the radiation-capture structure and the at least one thermoelectric converter are located entirely in said evacuated housing.

5. The solar-electrical generator of claim 4, wherein:
at least a portion of each of said front and back surfaces exhibits an emissivity less than about 0.1 over a temperature range of about 50° C. to about 500° C.; and
said front surface exhibits an absorptivity to solar radiation greater than about 80%.

6. The solar-electrical generator of claim 5, wherein said solar electrical generator exhibits a solar energy conversion of at least 4%.

7. The solar-electrical generator of claim 6, wherein a temperature difference between the high-temperature and a low-temperature ends of said thermoelectric converter is at least about 100° C. and the high-temperature end of said thermoelectric converter operates at a temperature above 150° C.

8. The solar-electrical generator of claim 5, further comprising a support structure coupled to a low-temperature end of said thermoelectric converter, said support structure comprising: an inner surface adapted to face said back surface of the radiation capture structure, wherein said inner surface of the support structure exhibits an overall emissivity less than about 0.1.

9. The solar-electrical generator of claim 5, further comprising at least one heat-diffusing element disposed between said front and back surfaces of the radiation capture structure, wherein said at least one heat-diffusing element provides a lateral heat conductivity in the radiation-capture structure having a value greater than about 20 W/m K.

10. The solar-electrical generator of claim 1, wherein the at least one thermoelectric converter comprises:
at least one n-type thermoelectric leg and at least one p-type thermoelectric leg thermally coupled to form a junction, wherein each of said legs is characterized by an axial direction, said at least one n-type leg and at least one p-type leg being disposed relative to one another such that an angle between said axial directions lies in a range from about 0 degrees to about 180 degrees; and
at least one radiation collector adapted to collect and concentrate incident solar radiation, said at least one radiation collector adapted to direct concentrated solar radiation to the junction;
wherein said at least one n-type leg and at least one p-type leg comprise a plurality of pairs of n-type and p-type legs, said n-type and p-type legs of each pair being linearly aligned, and sharing a pair junction; and
wherein at least two pairs of n-type and p-type legs share a common junction.

11. The solar-electrical generator of claim 1, comprising:
a plurality of the thermoelectric converters thermally coupled to said radiation-capture structure such that each converter receives at least a portion of said generated heat to create a temperature differential between its high-temperature and low-temperature ends;
wherein a spatial arrangement of the converters relative to said radiation-capture structure is adapted such that a temperature differential of at least about 50° C. is generated between the high temperature and the low-temperature ends of each converter in response to incident solar radiation on said radiation-capture structure, the low-temperature ends of said converters being maintained at a temperature below about 90° C.

12. The solar-electrical generator of claim 5, wherein said front surface exhibits a lateral thermal conductivity greater than about 20 W/mK.

13. The solar-electrical generator of claim 1, comprising:
a barrier structure enclosing an isolated environment, said barrier structure being at least partially transmissive to one or more solar radiation wavelengths to allow transmission of said radiation wavelengths into the evacuated environment, wherein at least one thermoelectric converter is disposed in said isolated environment;
a radiation concentrator optically coupled to said isolated environment so as to direct solar radiation to heat a portion of said thermoelectric converter to facilitate generation of a temperature differential across said converter; and
a heat spreader adapted to thermally couple to said at least one thermoelectric converter, said heat spreader adapted to remove heat from a portion of said at least one thermoelectric converter.

14. The solar-electrical generator of claim 1, further comprising:
an optical concentrator optically coupled to said radiation capture structure so as to direct solar radiation thereto, wherein said radiation capture structure comprises at least one protruding element adapted to receive at least a portion of the radiation directed by said optical concentrator onto said structure, said at least one protruding element generating heat in response to solar radiation exposure.

15. The solar-electrical generator of claim 1, wherein the radiation capture structure further includes a solar capture surface to capture solar radiation and to generate heat in the radiation-capture structure; the solar electrical generator further comprising:
a solar collecting transmitter closely coupled with the solar capture surface of the radiation capture structure, the solar transmitter adapted to collect and concentrate incident solar radiation onto the solar capture surface of the radiation-capture structure.

16. The solar-electrical generator of claim 15, wherein the radiation capture structure comprises at least one protruding element adapted to receive at least a portion of the radiation directed by said solar collecting transmitter from multiple directions.

17. The solar-electrical generator of claim 13, wherein:
said barrier structure has a bulb-like shape; and
a radiation-capture structure is coupled to the at least one thermoelectric converter in the isolated environment.

18. The solar-electrical generator of claim 13, wherein the isolated environment comprises an environment with lower heat capacity than atmospheric pressure.

19. The solar-electrical generator of claim 13, wherein the isolated environment comprises an evacuated environment relative to atmospheric pressure.

20. The solar-electrical generator of claim 1, wherein the backing structure is coupled to a fluid loop which is located at least partially in the evacuated housing and at least partially outside the housing.

21. A solar-electrical generator, comprising:
- an evacuated housing having at least a top surface which is transparent to solar radiation;
- a radiation-capture structure comprising a panel having a thermal conductivity of greater than about 20 W/m K located in the evacuated housing, the radiation-capture structure panel having a front surface and a back surface, said front surface being adapted for exposure to solar radiation so as to generate heat;
- at least one thermoelectric converter physically and thermally coupled to said a radiation-capture structure at a high temperature end thereof to receive at least a portion of said generated heat such that a temperature differential is achieved across the at least one thermoelectric converter, the at least one thermoelectric converter having a plurality of p-n leg pairs; and
- a backing structure located in the evacuated housing, wherein the backing structure contacts a low-temperature end of said thermoelectric converter;

wherein:
- said entire backing structure is located entirely in the evacuated housing wherein said housing is made from glass or plastic which is transparent to the solar radiation;
- said radiation-capture structure does not physically contact the evacuated housing except indirectly through the at least one thermoelectric converter;
- said radiation-capture structure is characterized by a capture area of the front surface adapted to be exposed to solar radiation, and the plurality of thermoelectric converters are characterized by a converter area, a ratio of capture area to converter area being greater than about 100; and
- said radiation capture structure is continuous for plural p-n leg pairs.

22. The solar-electrical generator of claim 21, wherein the ratio of capture area to converter area is greater than about 300.

23. The solar-electrical generator of claim 21, wherein the ratio of capture area to converter area is greater than about 500.

24. The solar-electrical generator of claim 21, wherein the radiation-capture structure panel comprises a flat or curved plate comprising one or more metal layers.

25. The solar-electrical generator of claim 21, wherein
- at least a portion of each of said front and back surfaces exhibits an emissivity less than about 0.1 over a temperature range of about 100° C. to about 500° C.;
- said front surface exhibits an absorptivity to solar radiation greater than about 80%; and
- a temperature difference between the high-temperature and a low-temperature ends of said thermoelectric converter is at least about 100° C.

26. The solar-electrical generator of claim 21, wherein the solar-electrical generator is configured such that the entire radiation capture structure is exposed to solar radiation which is concentrated less than 4 times.

27. The solar-electrical generator of claim 26, wherein the solar-electrical generator is configured such that the entire radiation capture structure is exposed to the solar radiation which is concentrated less than 2 times.

28. The solar-electrical generator of claim 21, wherein the backing structure is coupled to a fluid loop which is located at least partially in the evacuated housing and at least partially outside the housing.

* * * * *

UNITED STATES PATENT AND TRADEMARK OFFICE
CERTIFICATE OF CORRECTION

| | | |
|---|---|---|
| PATENT NO. | : 8,168,879 B2 | Page 1 of 1 |
| APPLICATION NO. | : 12/431052 | |
| DATED | : May 1, 2012 | |
| INVENTOR(S) | : Gang Chen et al. | |

It is certified that error appears in the above-identified patent and that said Letters Patent is hereby corrected as shown below:

Title Page:

Item 73 should read

Assignee:    Massachusetts Institute of Technology, Cambridge, MA (US)
<u>Trustees of Boston College, Chestnut Hill, MA (US)</u>

Signed and Sealed this
Nineteenth Day of February, 2013

Teresa Stanek Rea
*Acting Director of the United States Patent and Trademark Office*